United States Patent
Zaitsu

(10) Patent No.: US 9,786,365 B2
(45) Date of Patent: Oct. 10, 2017

(54) INTEGRATED CIRCUIT

(71) Applicant: Kabushiki Kaisha Toshiba, Minato-ku (JP)

(72) Inventor: Koichiro Zaitsu, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/220,772

(22) Filed: Jul. 27, 2016

(65) Prior Publication Data

US 2017/0033122 A1    Feb. 2, 2017

(30) Foreign Application Priority Data

Jul. 31, 2015    (JP) .................. 2015-152640

(51) Int. Cl.
| | |
|---|---|
| *G11C 13/00* | (2006.01) |
| *G11C 17/16* | (2006.01) |
| *G11C 17/18* | (2006.01) |
| *H01L 45/00* | (2006.01) |
| *H03K 19/173* | (2006.01) |
| *H03K 19/177* | (2006.01) |

(52) U.S. Cl.
CPC ........ *G11C 13/0002* (2013.01); *G11C 17/165* (2013.01); *G11C 17/18* (2013.01); *H01L 45/04* (2013.01); *H01L 45/1233* (2013.01); *H01L 45/145* (2013.01); *H01L 45/146* (2013.01); *H03K 19/1736* (2013.01); *H03K 19/17744* (2013.01)

(58) Field of Classification Search
CPC ................................. G11C 13/0002
USPC .......................................... 365/148
See application file for complete search history.

(56) References Cited

U.S. PATENT DOCUMENTS

| | | | |
|---|---|---|---|
| 8,004,873 B2 | 8/2011 | Toda | |
| 8,254,192 B2 | 8/2012 | Tsuchida | |
| 8,614,925 B2 | 12/2013 | Park et al. | |
| 2004/0125681 A1* | 7/2004 | Yamaoka | G11C 11/417 365/229 |

(Continued)

FOREIGN PATENT DOCUMENTS

| | | |
|---|---|---|
| JP | 2009-199695 A | 9/2009 |
| JP | 2010-146665 A | 7/2010 |

(Continued)

*Primary Examiner* — Min Huang
(74) *Attorney, Agent, or Firm* — Oblon, McClelland, Maier & Neustadt, L.L.P.

(57) ABSTRACT

An integrated circuit according to an embodiment includes: a first wiring line group including at least three first wiring lines; a second wiring line group including second wiring lines; first resistive change elements each including a first and second terminals, and a first resistive change layer; a first select circuit including first input terminals connected to the second wiring lines and a first output terminal, the first select circuit selecting a first input terminal from the first input terminals, and output information from the first output terminal; a third and fourth wiring lines; and a second select circuit selecting two first wiring lines from the first wiring line group, connecting one of the selected two first wiring lines to the third wiring line, and connecting the other one of the selected two first wiring lines to the fourth wiring line.

19 Claims, 18 Drawing Sheets

(56) References Cited

U.S. PATENT DOCUMENTS

| | | | |
|---|---|---|---|
| 2006/0067097 A1* | 3/2006 | Lien | G11C 11/22 |
| | | | 365/49.13 |
| 2008/0084724 A1* | 4/2008 | Nozieres | G11C 11/16 |
| | | | 365/50 |
| 2010/0110744 A1* | 5/2010 | El Baraji | G11C 15/046 |
| | | | 365/50 |
| 2012/0026779 A1* | 2/2012 | Ikegami | G11C 13/0002 |
| | | | 365/148 |
| 2014/0153310 A1* | 6/2014 | Sekar | G11C 15/00 |
| | | | 365/49.15 |
| 2014/0269006 A1* | 9/2014 | Sekar | G11C 13/0002 |
| | | | 365/148 |
| 2015/0371683 A1* | 12/2015 | Vorbach | G11C 5/02 |
| | | | 365/51 |
| 2016/0104532 A1* | 4/2016 | Petti | G11C 15/046 |
| | | | 365/49.17 |
| 2016/0203859 A1 | 7/2016 | Zaitsu et al. | |
| 2016/0203860 A1 | 7/2016 | Ho et al. | |
| 2016/0203866 A1* | 7/2016 | Zaitsu | G11C 13/0002 |
| | | | 365/63 |
| 2016/0276025 A1 | 9/2016 | Tatsumura et al. | |

FOREIGN PATENT DOCUMENTS

| | | |
|---|---|---|
| JP | 2012-169023 A | 9/2012 |
| JP | 2016-129081 A | 7/2016 |
| JP | 2016-129318 A | 7/2016 |
| JP | 2016-178229 A | 10/2016 |

\* cited by examiner

INTEGRATED CIRCUIT

CROSS REFERENCE TO RELATED APPLICATIONS

This application is based upon and claims the benefit of priority from prior Japanese Patent Application No. 2015-152640 filed on Jul. 31, 2015 in Japan, the entire contents of which are incorporated herein by reference.

FIELD

Embodiments described herein relate generally to integrated circuits.

BACKGROUND

A programmable logic device is a reconfigurable circuit that can be rewritten after a chip is manufactured. Such a programmable logic device includes a rewritable wiring unit and a rewritable logic circuit. The rewritable wiring unit includes wiring lines and memories, and is capable of electrically connecting or disconnecting designated two wiring lines in accordance with the information stored in the memories.

The rewritable logic circuit includes a look-up table circuit. The look-up table circuit is a circuit that stores logics into memories, and controls outputs in accordance with the information stored in the memories.

Static random access memories (SRAMs) are normally used as the respective memories in the rewritable wiring unit and the rewritable logic circuit. However, SRAMs are volatile memories, and the data stored in the SRAMs will be lost when the power is turned off. Therefore, it is necessary to load data into the SRAMs from an external nonvolatile memory after the power is turned on. As a result, the start time after power activation is long.

Meanwhile, there is a known method with which a resistive change memory is used as each memory in the rewritable wiring unit. The resistive change memory includes nonvolatile resistive change elements each having two electrodes, for example. As a predetermined voltage is applied between the electrodes, the resistance between the electrodes can be switched from a low-resistance state to a high-resistance state, or from a high-resistance state to a low-resistance state. With such a resistive change element being disposed between two wiring lines, it is possible to control connection/disconnection of the wiring lines by changing the resistance state of the resistive change element. Resistive change memories can also be used as the memories in the rewritable logic circuit.

A circuit that uses a resistive change memory including a large number of resistive change elements is likely to have defects. This is because the defect rate in a resistive change memory is higher than the defect rate in an SRAM. In view of this, there is a demand for a defect recovery method for enabling a correct circuit operation even when some of the resistive change elements in the circuit are defective. However, there are no known methods for recovering a circuit in a programmable logic device using resistive change memories, or more particularly, in a look-up table circuit using resistive change memories.

DETAILED DESCRIPTION

An integrated circuit according to an embodiment includes: a first wiring line group including at least three first wiring lines; a second wiring line group including a plurality of second wiring lines intersecting with the first wiring lines; a plurality of first resistive change elements disposed in intersection regions between the first wiring lines and the second wiring lines, the first resistive change elements each including a first terminal, a second terminal, and a first resistive change layer interposed between the first terminal and the second terminal, the first terminal being connected to a corresponding one of the first wiring lines, and the second terminal being connected to a corresponding one of the second wiring lines; a first select circuit including a plurality of first input terminals connected to the second wiring lines and a first output terminal, the first select circuit configured to select a first input terminal from the first input terminals in accordance with a select signal, and output information from the first output terminal, the information corresponding to information input to the selected first input terminal; a third wiring line; a fourth wiring line; and a second select circuit configured to select two first wiring lines from the first wiring line group, connect one of the selected two first wiring lines to the third wiring line, and connect the other one of the selected two first wiring lines to the fourth wiring line.

The background to the development of embodiments is explained before the embodiments are described.

Figure 1:
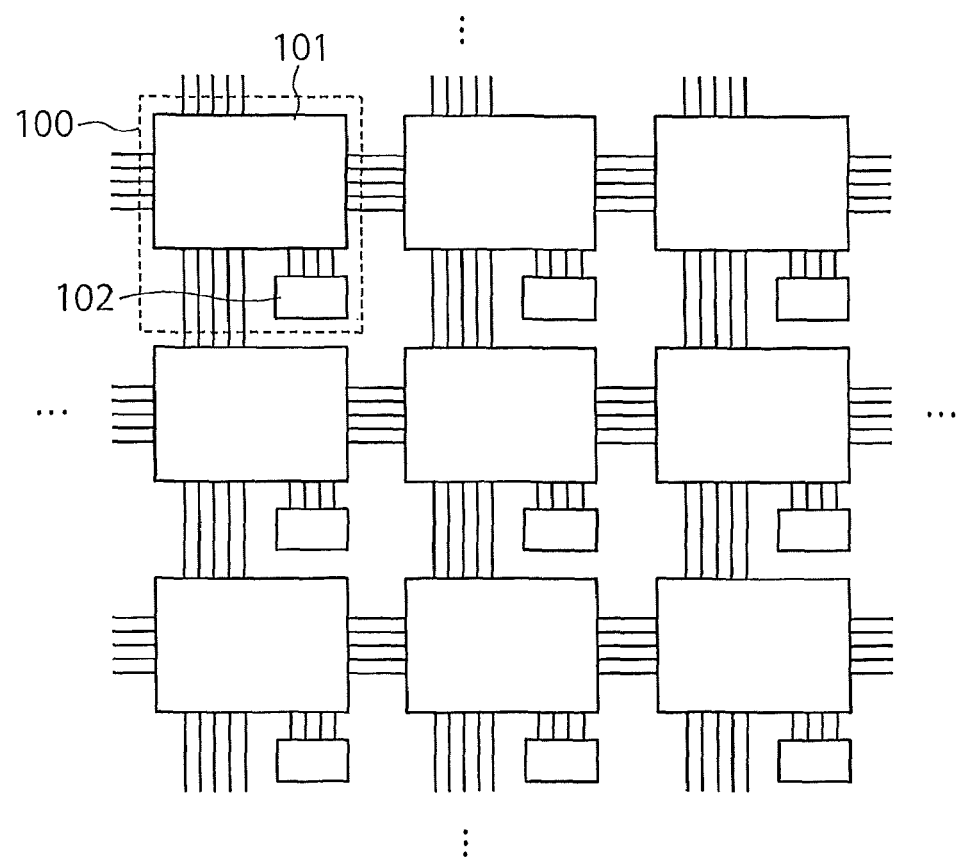
FIG. 1 is a diagram showing an example configuration of a programmable logic device (a reconfigurable circuit)

FIG. 1 shows an example configuration of a programmable logic device (a reconfigurable circuit); In the programmable logic device shown in FIG. 1, basic blocks 100 each including a rewritable wiring unit 101 and a rewritable logic circuit 102 are arranged in a matrix fashion. Each one basic block 100 is connected to adjacent basic blocks 100. Each rewritable wiring unit 101 includes a memory formed with memory elements, and is capable of controlling connection/disconnection between wiring lines in accordance with information stored in the memory. Likewise, each rewritable logic circuit 102 includes a memory formed with memory elements, and is capable of performing various logic operations in accordance with information stored in the memory.

In a conventional programmable logic device, an SRAM is used as the memory. However, an SRAM occupies a large area in the chip. Further, an SRAM is a volatile memory, and therefore, information will be lost when the power is turned off.

In view of this, instead of an SRAM, a memory that includes resistive change elements as memory elements is used in a programmable logic device in each embodiment.

Figure 2:
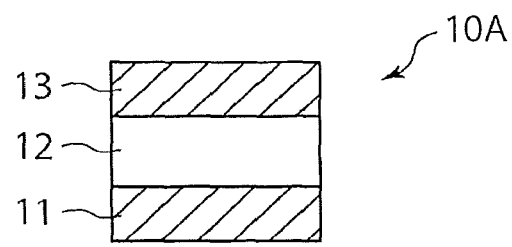
FIG. 2 is a cross-sectional view of a resistive change element a first specific example.

FIG. 2 shows a structure of a first specific example of a resistive change element. The resistive change element 10A of the first specific example includes electrodes 11 and 13, and a resistive change layer 12 interposed between these electrodes. The resistive change layer 12 can be formed with a metal oxide, such as a titanium oxide, a hafnium oxide, a tantalum oxide, or an aluminum oxide. Alternatively, the resistive change layer 12 may be formed with a semiconductor oxide such as a silicon oxide or a semiconductor material such as amorphous silicon, or may be formed with a film stack including those materials.

In the resistive change element of the first specific example, a predetermined voltage is applied to the electrodes 11 and 13, or a predetermined current is made to flow between the electrodes 11 and 13, so that the electrical resistance between the electrodes 11 and 13 can be reversibly switched from a low-resistance state to a high-resistance state, or from a high-resistance state to a low-resistance state.

While an SRAM is formed in the same layer as a CMOS circuit other than the SRAM, the memory including the resistive change element 10A of the first specific example shown in FIG. 2 can be formed in a layer above the layer in which a CMOS circuit is formed. Even if the number of resistive change elements becomes larger, an Increase in the area of the entire chip can be restrained. Since the memory including resistive change elements is a nonvolatile memory, the data will not be lost when the power is turned off.

A one-time programmable memory element (OTP memory element) can be used as a second specific example of a resistive change element. An OTP memory element is a memory on which writing can be performed only once, and is characteristically manufactured by a low-cost manufacturing process. As the data in an OTP memory element cannot be rewritten, a high security level is also a feature of an OTP memory element. Further, an OTP memory element occupies a smaller area in a chip than an SRAM.

Figure 3A:
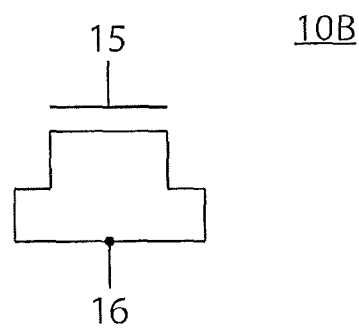
FIG. 3A is a diagram showing an example of a resistive change element of a second specific example.

As shown in FIG. 3A, an OTP element formed with a transistor having a source and a drain connected to each other can be used as the resistive change element of the second specific example. The OTP memory element 10B shown in FIG. 3A includes a terminal 15 connected to the gate of the transistor, and a terminal 16 connected to the source and the drain of the transistor. Although the state between the terminals 15 and 16 is a high-resistance state in the initial condition, a leak path is formed in the gate insulating film by writing, so that the state between the terminals 15 and 16 can be switched to a low-resistance state. That is, the gate insulating film serves as a resistive change layer, and this resistive change layer irreversibly switches from a high-resistance state to a low-resistance state.

The resistive change element of the second specific example shown in FIG. 3A is the OTP memory element 10B formed with a transistor in which the gate is connected to the terminal 15, and the terminal 16 is connected to both the source and the drain. However, an resistive change element 10C of a third specific example shown in FIG. 3B may be an OTP element formed with a transistor in which the terminal 15 is connected to the gate, and the terminal 16 is connected to the source or the drain.

Figure 3B:
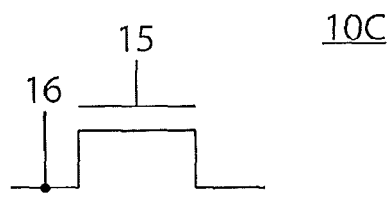
FIG. 3B is a diagram showing an example of a resistive change element of a third specific example.

Although the OTP elements shown in FIGS. 3A and 3B are n-channel transistors, p-channel transistors may be used. In a case where only the source or the drain is connected to the terminal 16 as in FIG. 3B, a diffusion layer doped with an impurity may not be formed in the source or the drain, whichever is not connected to the terminal 16.

Each of these resistive change elements includes two electrodes (terminals), and the resistance state between the electrodes (terminals) can be set at a low-resistance state or a high-resistance state. In the programmable logic device described below, a memory including resistive change elements as memory elements is used.

Figure 4:
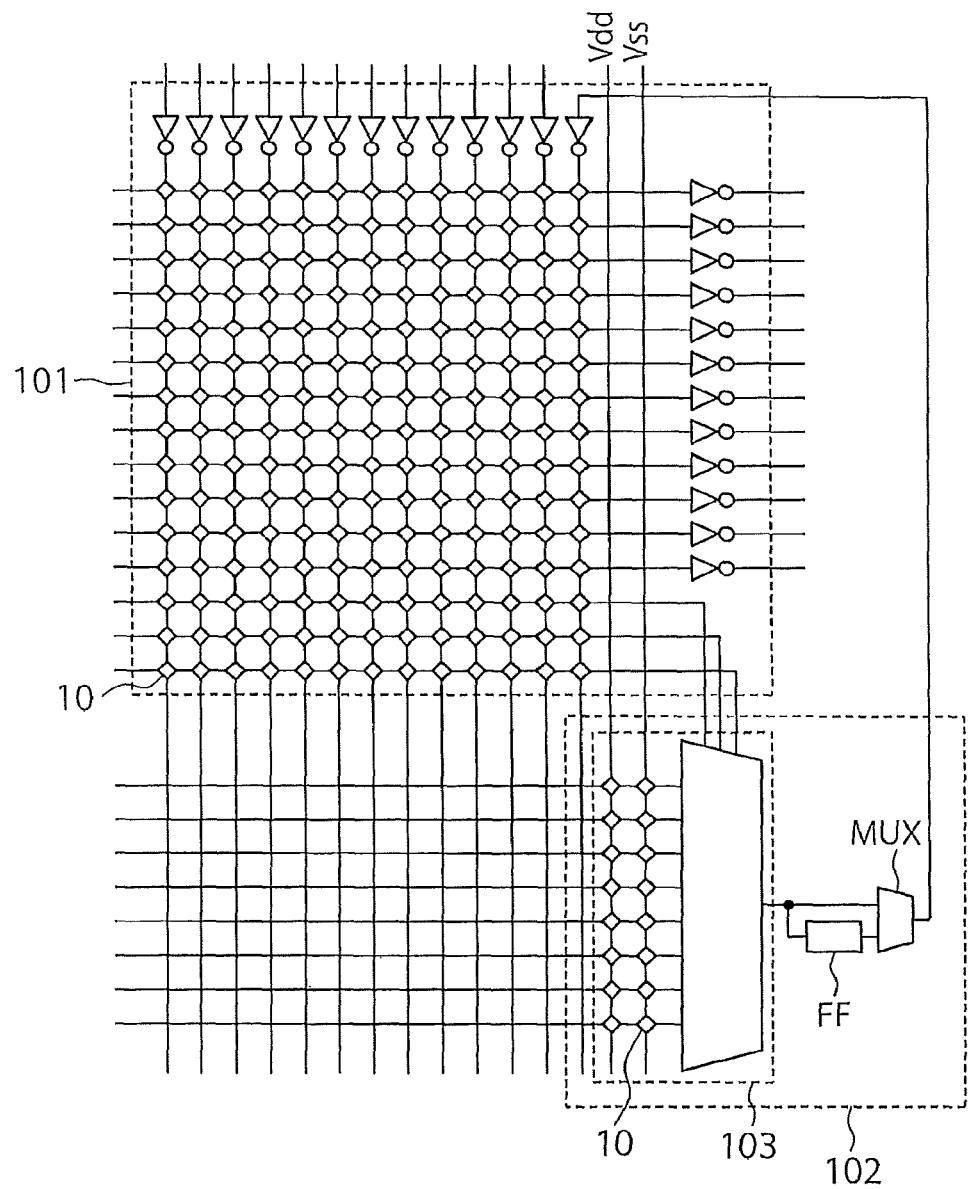
FIG. 4 is a diagram showing an example of a basic block that uses resistive change elements as memory elements.

FIG. 4 shows an example of a basic block 100 that uses resistive change elements as memory elements. In this basic block 100, each resistive change element 10 is disposed in an intersection region between a wiring line extending in the vertical direction and a wiring line extending in the horizontal direction. One of the electrodes 11 and 13 (or the terminals 15 and 16) of each resistive change element 10 is connected to one of the two wiring lines, and the other one of the electrodes 11 and 13 is connected to the other one of the two wiring lines. A rewritable logic circuit 102 includes a look-up table circuit 103, a flip-flop FF, and a multiplexer MUX.

Figure 5:
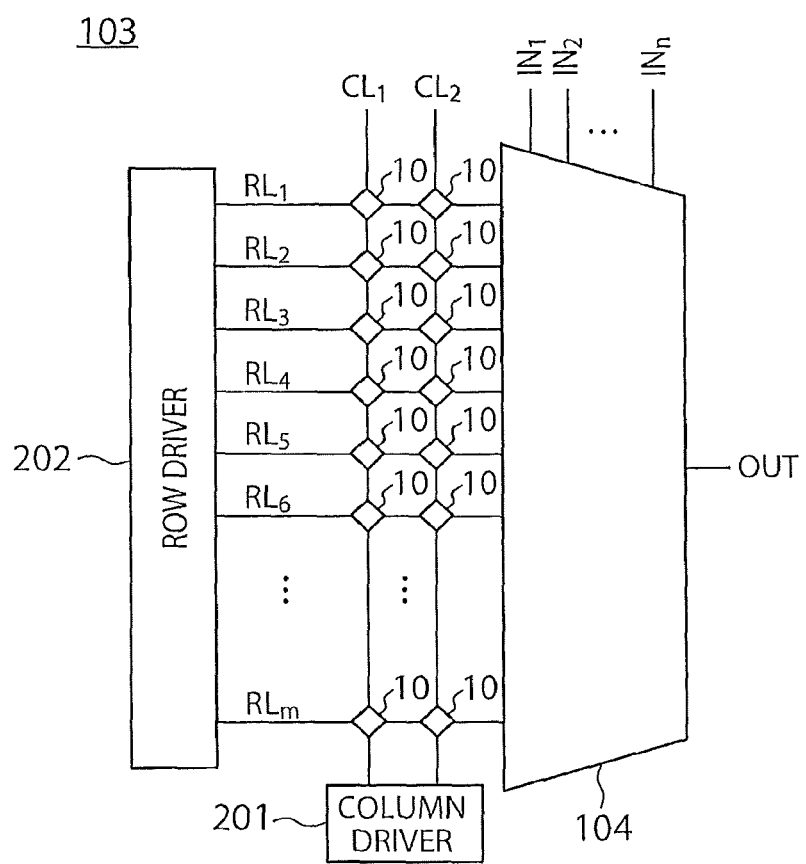
FIG. 5 is a diagram showing an example of a look-up table circuit.

FIG. 5 shows an example of the look-up table circuit 103. The look-up table circuit 103 in FIG. 5 includes n select lines $IN_1$ through $IN_n$, an output line OUT, a select circuit 104, two column wiring lines $CL_1$ and $CL_2$, m ($\geq 1$) row wiring lines $RL_1$ through $RL_m$, and memory elements 10 disposed at the Intersection points between the column wiring lines and the row wiring lines. Each of these memory elements 10 is one of the resistive change elements shown in FIGS. 2 through 3B, for example.

These resistive change elements 10 are disposed in the Intersection regions between the two column wiring lines $CL_1$ and $CL_2$, and the m ($\geq 1$) row wiring lines $RL_1$ through $RL_m$, as in the case explained with reference to FIG. 4. In a resistive change element 10, one of the two electrodes (or two terminals) is connected to the one of the two column wiring lines $CL_1$ and $CL_2$ corresponding to the intersection region in which the resistive change element 10 is disposed, and the other one of the two electrodes (or two terminals) is connected to the one of the m (≥1) row wiring lines $RL_1$ through $RL_m$ corresponding to the Intersection region in which the resistive change element 10 is disposed.

The column wiring lines $CL_1$ and $CL_2$ are connected to a column driver 201, and the row wiring lines $RL_1$ through $RL_m$ are connected to a row driver 202. The column driver 201 and the row driver 202 switch the resistance state of a selected memory element 10 by applying a write voltage to the selected memory element 10.

The two memory elements 10 located on the same row are programmed so that one of the memory elements 10 is put into a low-resistance state, and the other one of the memory elements 10 is put into a high-resistance state. When the look-up table circuit 103 is in operation, one of the column wiring lines $CL_1$ and $CL_2$ is connected to a first power supply that generates a power supply voltage, and the other one of the column wiring lines $CL_1$ and $CL_2$ is connected to a second power supply that generates a ground voltage. For example, of the two memory elements 10 connected to the row wiring line $RL_1$, the memory element 10 connected to the column wiring line $CL_1$ is put into a low-resistance state, and the memory element 10 connected to the column wiring line $CL_2$ is put into a high-resistance state. At this point of time, if the column wiring line $CL_1$ is connected to the first power supply, and the column wiring line $CL_2$ is connected to the second power supply, the potential of the row wiring line $RL_1$ becomes equal to the potential of the power supply voltage. Meanwhile, of the two memory elements 10 connected to the row wiring line $RL_2$, the memory element 10 connected to the column wiring line $CL_1$ is put into a high-resistance state, and the memory element 10 connected to the column wiring line $CL_2$ is put into a low-resistance state, so that the potential of the row wiring line $RL_2$ becomes equal to the potential of the ground voltage.

The select circuit 104 includes input terminals, an output terminal, and a select terminal. The input terminals are connected to the row wiring lines $RL_1$ through $RL_m$, respectively, the select terminal is connected to the select lines $IN_1$ through $IN_n$, and the output terminal is connected to the output line OUT. In accordance with information that is input through the select lines $IN_1$ through $IN_n$, the select circuit 104 selects one of the Input terminals. The Information corresponding to the signal input to the selected Input terminal is output from the output terminal. At this point of time, the potential of the selected input terminal and the potential of the output terminal may be the same, or the logic may be reversed. In a case where the logic is reversed, the potential of the output terminal is equal to the ground voltage when the potential of the selected input terminal is equal to the potential of the power supply voltage, and the potential of the output terminal is equal to the power supply voltage when the potential of the selected input terminal is equal to the potential of the ground voltage. Here, n is an integer that satisfies n≥1, and m is an integer that satisfies $2^{n-1}+1 \leq m \leq 2^n$.

The problem with the look-up table circuit 103 shown in FIG. 5 is now discussed.

Due to a problem caused during the manufacture process or the like, each memory element has a possibility of turning into a defective element. For example, the memory element (resistive change element) shown in FIG. 2 may be either in a defective condition in which the resistance state cannot be switched from a high-resistance state to a low-resistance state (or a defective condition in which a high-resistance state lasts permanently), or in a defective condition in which the resistance state cannot be switched from a low-resistance state to a high-resistance state (or a defective condition in which a low-resistance state lasts permanently). Also, each of the memory elements (resistive change elements) shown in FIGS. 3A and 3B may be in a defective condition in which the resistance state cannot be switched from a high-resistance state to a low-resistance state (or a defective condition in which a high-resistance state lasts permanently), or in a defective condition in which the memory element to be used in a high-resistance state is in a low-resistance state due to a problem caused during the manufacturing process or the like. If such a defective memory element exists in a circuit, a wrong signal is output, and the circuit might operate in an incorrect manner.

To solve the above problem, redundant bits (spare bit) can be used.

Specifically, spare memory elements are prepared in advance. When a defective memory element is detected, the defective memory element is replaced with a spare memory element. A reconfigurable circuit that includes a look-up table circuit having spare memory elements in the memory is described below as an embodiment.

First Embodiment

Figure 6:
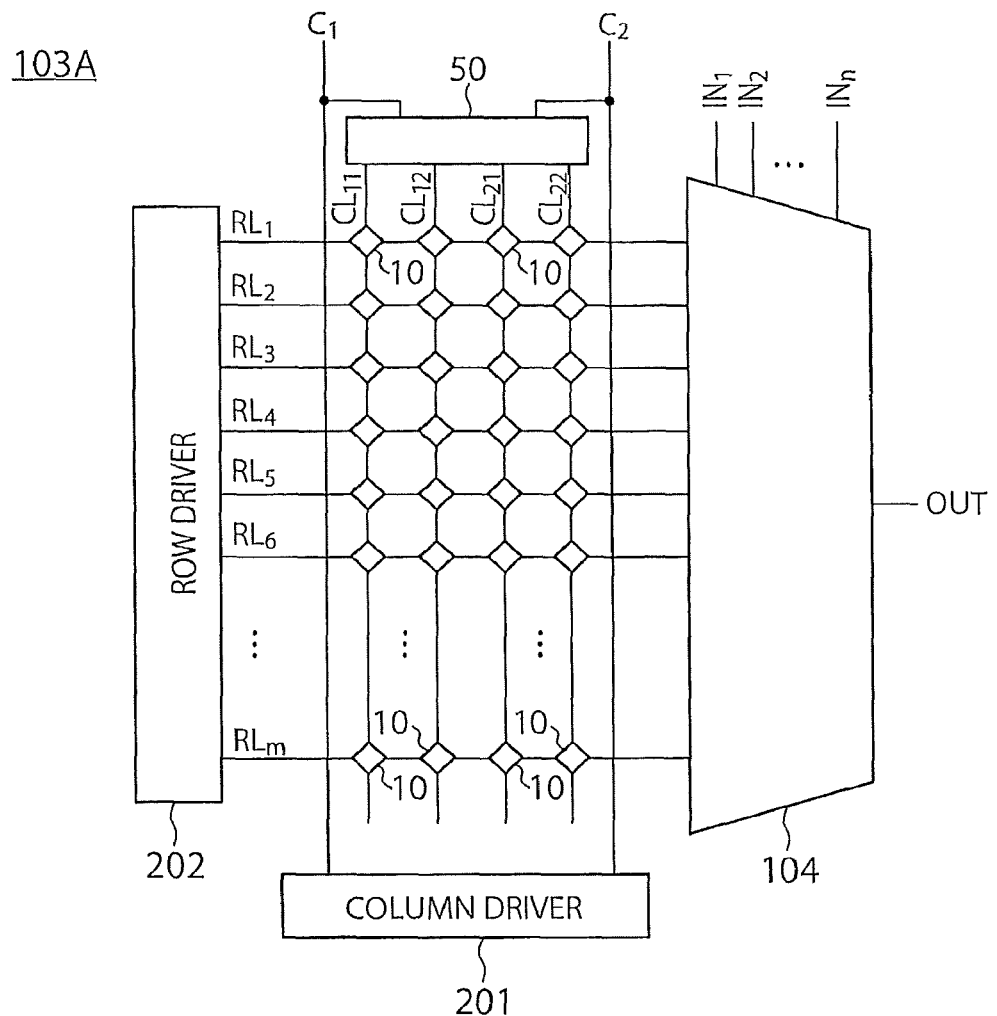
FIG. 6 is a diagram showing a look-up table circuit of a first embodiment.

Referring now to FIG. 6, an Integrated circuit according to a first embodiment is described. The Integrated circuit of the first embodiment includes a look-up table circuit 103A shown in FIG. 6. The look-up table circuit 103A according to the first embodiment includes n select lines $IN_1$ through $IN_n$, an output line OUT, a select circuit 104, two wiring lines $C_1$ and $C_2$, four column wiring lines $CL_{11}$, $CL_{12}$, $CL_{21}$, and $CL_{22}$, m (≥1) row wiring lines $RL_1$ through $RL_m$, memory elements 10 disposed in the Intersection regions between the column wiring lines and the row wiring lines, and a select circuit 50. Each of these memory elements 10 is one of the resistive change elements shown in FIGS. 2 through 3B, for example.

These resistive change elements 10 are disposed in the Intersection regions between the four column wiring lines $CL_{11}$, $CL_{12}$, $CL_{21}$, and $CL_{22}$, and the m (≥1) row wiring lines $RL_1$ through $RL_m$, as in the case explained with reference to FIG. 4. In a resistive change element 10, one of the two electrodes (or two terminals) is connected to the one of the four column wiring lines $CL_{11}$, $CL_{12}$, $CL_{21}$, and $CL_{22}$ corresponding to the intersection region in which the resistive change element 10 is disposed, and the other one of the two electrodes (or two terminals) is connected to the one of the m (≥1) row wiring lines $RL_1$ through $RL_m$ corresponding to the Intersection region in which the resistive change element 10 is disposed.

The wiring lines $C_1$ and $C_2$ are connected to a column driver 201, and the row wiring lines $RL_1$ through $RL_m$ are connected to a row driver 202 and the respective input terminals of the select circuit 104. The column driver 201 and the row driver 202 switch the resistance state of a selected memory element 10 by applying a write voltage to the selected memory element 10.

In the look-up table circuit 103A of the first embodiment, two column wiring lines are selected from among the column wiring lines $CL_{11}$, $CL_{12}$, $CL_{21}$, and $CL_{22}$ by the select circuit 50. One of the selected two column wiring lines is connected to the wiring line $C_1$, and the other one is connected to the wiring line $C_2$. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss.

In this case, the column wiring lines other than the two column wiring lines selected from among the column wiring lines $CL_{11}$, $CL_{12}$, $CL_{21}$, and $CL_{22}$ can be regarded as spares of the selected two column wiring lines. For example, in a case where the memory elements connected to the column wiring line $CL_1$ Include a memory element in a defective condition, the select circuit 50 selects two column wiring lines from among the column wiring lines $CL_{12}$, $CL_{21}$, and $CL_{22}$, and connects one of the selected two column wiring lines to the wiring line $C_1$, and the other one to the wiring line $C_2$.

In the first embodiment designed as above, even if the memory elements in the look-up table circuit include a memory element in a defective condition, only memory elements not in a defective condition are selected and used, so that the circuit can be made to operate properly.

Next, a method of performing writing on a memory element 10 in the look-up table circuit 103A of the first embodiment is described. In the example case described below, the column wiring lines $CL_{11}$ and $CL_{21}$ are selected by the select circuit 50, the column wiring line $CL_{11}$ is connected to the wiring line $C_1$ via the select circuit 50, and the column wiring line $CL_{21}$ is connected to the wiring line $C_2$ via the select circuit 50. In this case, writing on the memory element 10 disposed in the intersection region between the row wiring line $RL_1$ and the column wiring line $CL_{11}$ is performed in the manner described below.

A write voltage Vprg is applied to the row wiring line $RL_1$ via the row driver 202, and a write inhibition voltage Vinh (=Vprg/2, for example) is applied to each of the other row wiring lines $RL_2$ through $RL_m$ via the row driver 202. Meanwhile, 0 V is applied to the column wiring line $CL_{11}$ via the column driver 201, the wiring line $C_1$, and the select circuit 50, and the write inhibition voltage Vinh is applied to the column wiring line $CL_{21}$ via the column driver 201, the wiring line $C_2$, and the select circuit 50. Here, the write inhibition voltage Vinh is an intermediate voltage between the write voltage Vprg and 0 V.

As a result, the write voltage Vprg is applied between the two electrodes (or terminals) of the selected memory element 10, and writing is performed. However, Vprg/2 or 0 V is applied between the two electrodes (or terminals) of each unselected memory element, and therefore, writing is not performed on the unselected memory elements.

In the above described case, when writing is to be performed on the selected memory element 10, the program voltage Vprg is applied to the row wiring line $RL_1$, and 0 V is applied to the column wiring line $CL_{11}$. However, 0 V may be applied to the row wiring line $RL_1$, and the program voltage Vprg may be applied to the column wiring line $CL_{11}$.

In the look-up table circuit 103A of the first embodiment, two memory elements 10 located on the same row are programmed so that one of the memory elements 10 is put into a low-resistance state, and the other one of the memory elements 10 is put into a high-resistance state, as in the look-up table circuit 103 shown in FIG. 5.

When the look-up table circuit 103A of the first embodiment is in operation, one of the wiring lines $C_1$ and $C_2$ is connected to the first voltage supply that generates the power supply voltage Vdd, and the other one of the wiring lines $C_1$ and $C_2$ is connected to the second voltage supply that generates the ground voltage Vss. For example, of two memory elements 10 connected to the row wiring line $RL_1$, the memory element 10 connected to the wiring line $C_1$ is put into a low-resistance state, and the memory element 10 connected to the wiring line $C_2$ is put into a high-resistance state. At this point of time, if the wiring line $C_1$ is connected to the first voltage supply, and the wiring line $C_2$ is connected to the second voltage supply, the potential of the row wiring line $RL_1$ becomes equal to the potential of the power supply voltage Vdd. Meanwhile, of two memory elements 10 connected to the row wiring line $RL_2$, the memory element 10 connected to the wiring line $C_1$ is put into a high-resistance state, and the memory element 10 connected to the wiring line $C_2$ is put into a low-resistance state, so that the potential of the row wiring line $RL_2$ becomes equal to the potential of the ground voltage Vss.

The select circuit 104 includes input terminals, an output terminal, and a select terminal. The input terminals are connected to the row wiring lines $RL_1$ through $RL_m$, respectively, the select terminal is connected to the select lines $IN_1$ through $IN_n$, and the output terminal is connected to the output line OUT. In accordance with information (signals) that is input through the select lines $IN_1$ through $IN_n$, the select circuit 104 selects one of the input terminals. The Information corresponding to the signal input to the selected input terminal is output from the output terminal. At this point of time, the potential of the selected input terminal and the potential of the output terminal may be the same, or the logic may be reversed. In a case where the logic is reversed, the potential of the output terminal is equal to the ground voltage Vss when the potential of the selected input terminal is equal to the potential of the power supply voltage Vdd, and the potential of the output terminal is equal to the power supply voltage Vdd when the potential of the selected input terminal is equal to the potential of the ground voltage Vss. Here, n is an Integer that satisfies n≥1, and m is an integer that satisfies $2^{n-1}+1 \leq m \leq 2^n$. In this manner, the select circuit 104 functions as a multiplexer. Hereinafter, the select circuit 104 will be explained also as the multiplexer 104.

As described above, even if the memory elements in the look-up table circuit 103A of the first embodiment include a memory element in a defective condition, a spare memory element is used so that the look-up table circuit 103A can be made to operate properly. Thus, the chip yield can be made higher than that in a case where the look-up table circuit 103 shown in FIG. 5 is used. That is, it is possible to provide a reconfigurable circuit including a look-up table circuit that can reduce the defect rate.

First Modification

Figure 7A:
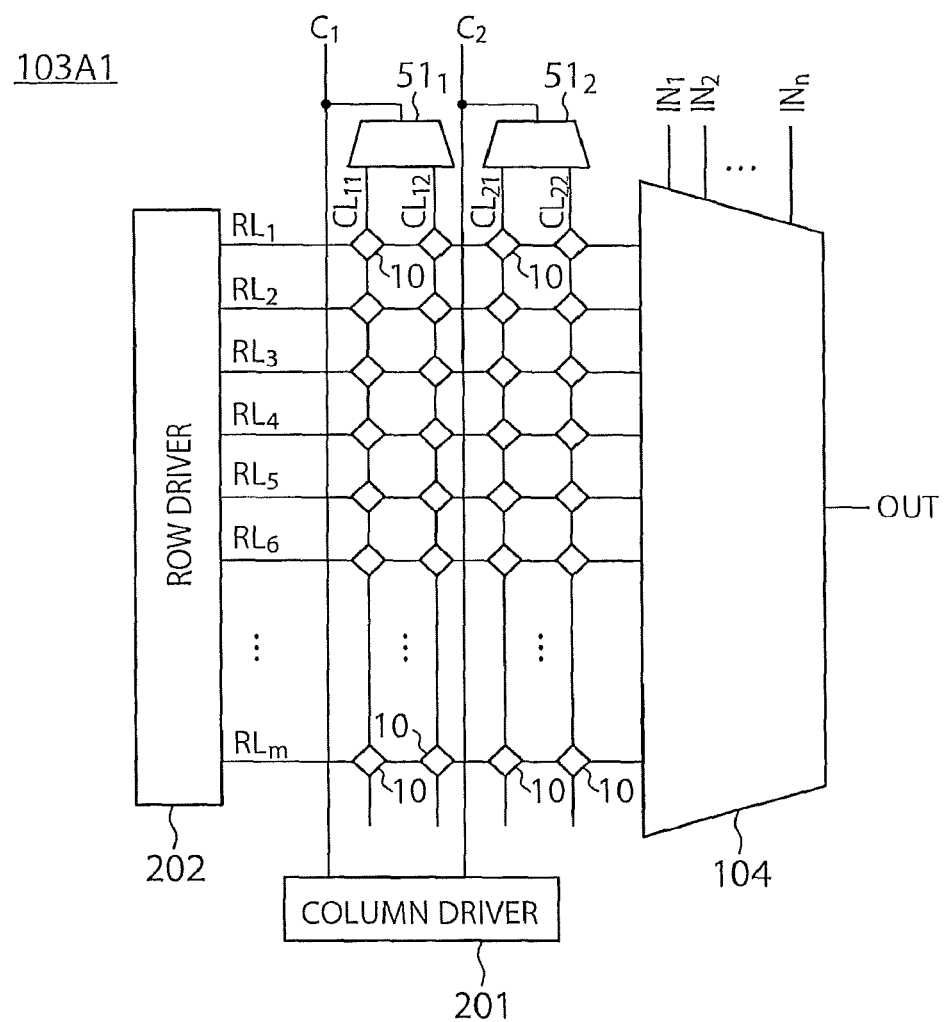
FIG. 7A is a diagram showing a look-up table circuit of a first modification of the first embodiment.

Referring now to FIG. 7A, an integrated circuit according to a first modification of the first embodiment is described. The integrated circuit of the first modification includes a look-up table circuit 103A1 shown in FIG. 7A. The look-up table circuit 103A1 according to the first modification includes n select lines $IN_1$ through $IN_n$, an output line OUT, a multiplexer 104, two wiring lines $C_1$ and $C_2$, four column wiring lines $CL_{11}$, $CL_{12}$, $CL_{21}$, and $CL_{22}$, m (≥1) row wiring lines $RL_1$ through $RL_m$, memory elements 10 disposed in the Intersection regions between the column wiring lines and the row wiring lines, and switch circuits (demultiplexers) $51_1$ and $51_2$. Each of these memory elements 10 is one of the resistive change elements shown in FIGS. 2 through 3B, for example. That is, the select circuit 50 in the first embodiment shown in FIG. 6 is replaced with the two switch circuits $51_1$ and $51_2$.

These resistive change elements 10 are disposed in the intersection regions between the four column wiring lines $CL_{11}$, $CL_{12}$, $CL_{21}$, and $CL_{22}$, and the m (≥1) row wiring lines $RL_1$ through $RL_m$, as in the case explained above with reference to FIG. 4. In a resistive change element 10, one of the two electrodes (or two terminals) is connected to the one of the four column wiring lines $CL_{11}$, $CL_{12}$, $CL_{21}$, and $CL_{22}$ corresponding to the intersection region in which the resistive change element 10 is disposed, and the other one of the two electrodes (or two terminals) is connected to the one of the m (≥1) row wiring lines $RL_1$ through $RL_m$ corresponding to the intersection region in which the resistive change element 10 is disposed.

The wiring lines $C_1$ and $C_2$ are connected to a column driver 201, and the row wiring lines $RL_1$ through $RL_m$ are connected to a row driver 202 and the respective input terminals of the multiplexer 104. The column driver 201 and the row driver 202 switch the resistance state of a selected memory element 10 by applying a write voltage to the selected memory element 10.

In the look-up table circuit 103A1 of the first modification, one of the column wiring lines $CL_{11}$ and $CL_{12}$ is connected to the wiring line $C_1$ via the switch circuit 51₁, and one of the column wiring lines $CL_{21}$ and $CL_{22}$ is connected to the wiring line $C_2$ via the switch circuit 51₂. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss.

In this example, the column wiring line $CL_{11}$ and the column wiring line $CL_{12}$ form a pair, and one of them is used. That is, the column wiring line $CL_{12}$ can be regarded as a spare of the column wiring line $CL_{11}$. For example, in a case where the memory elements connected to the column wiring line $CL_{11}$ include a memory element in a defective condition, the switch circuit 51₁ connects the column wiring line $CL_{12}$ to the wiring line $C_1$. In a case where the memory elements connected to the column wiring line $CL_{12}$ include a memory element in a defective condition, on the other hand, the switch circuit 51₁ connects the column wiring line $CL_{11}$ to the wiring line $C_1$. Likewise, the column wiring line $CL_{21}$ and the column wiring line $CL_{22}$ form a pair, and one of them is used. That is, the switch circuit 51₂ also connects the column wiring line not having any defective memory element connected thereto, to the wiring line $C_2$.

In the first modification of the first embodiment designed as above, even if the memory elements in the look-up table circuit include a memory element in a defective condition, only memory elements not in a defective condition are selected and used, so that the circuit can be made to operate properly.

Next, a method of performing writing on a memory element 10 in the look-up table circuit 103A1 of the first modification is described. In the example case described below, of the two column wiring lines $CL_{11}$ and $CL_{12}$, the column wiring line $CL_{11}$ is connected to the wiring line $C_1$ via the switch circuit 51₁. Of the two column wiring lines $CL_{21}$ and $CL_{22}$, the column wiring line $CL_{21}$ is connected to the wiring line $C_2$ via the switch circuit 51₂. In this case, writing on the memory element 10 disposed in the intersection region between the row wiring line $RL_1$ and the column wiring line $CL_{11}$ is performed in the manner described below.

A write voltage Vprg is applied to the row wiring line $RL_1$ via the row driver 202, and a write inhibition voltage Vinh (=Vprg/2, for example) is applied to each of the other row wiring lines $RL_2$ through $RL_m$ via the row driver 202. Meanwhile, 0 V is applied to the column wiring line $CL_{11}$ via the column driver 201, and the switch circuit 51₁, and the write inhibition voltage Vinh is applied to the column wiring line $CL_{21}$ via the column driver 201, the wiring line $C_2$, and the switch circuit 51₂. Here, the write inhibition voltage Vinh is an intermediate voltage between the write voltage Vprg and 0 V.

As a result, the write voltage Vprg is applied between the two electrodes (or terminals) of the selected memory element 10, and writing is performed. However, Vprg/2 or 0 V is applied between the two electrodes (or terminals) of each unselected memory element, and therefore, writing is not performed on the unselected memory elements.

In the above described case, when writing is to be performed on the selected memory element 10, the program voltage Vprg is applied to the row wiring line $RL_1$, and 0 V is applied to the column wiring line $CL_{11}$. However, 0 V may be applied to the row wiring line $RL_1$, and the program voltage Vprg may be applied to the column wiring line $CL_{11}$. The write inhibition voltage VInh to be applied to a row wiring line and the write inhibition voltage Vinh to be applied to a column wiring line may be different voltages from each other.

In the look-up table circuit 103A1 of the first modification, two memory elements 10 located on the same row are programmed so that one of the memory elements 10 is put into a low-resistance state, and the other one of the memory elements 10 is put into a high-resistance state, as in the look-up table circuit 103 shown in FIG. 5.

When the look-up table circuit 103A1 of the first modification is in operation, one of the wiring lines $C_1$ and $C_2$ is connected to the first voltage supply that generates the power supply voltage Vdd, and the other one of the wiring lines $C_1$ and $C_2$ is connected to the second voltage supply that generates the ground voltage Vss. For example, of two memory elements 10 connected to the row wiring line $RL_1$, the memory element 10 connected to the wiring line $C_1$ is put into a low-resistance state, and the memory element 10 connected to the wiring line $C_2$ is put into a high-resistance state. At this point of time, if the wiring line $C_1$ is connected to the first voltage supply, and the wiring line $C_2$ is connected to the second voltage supply, the potential of the row wiring line $RL_1$ becomes equal to the potential of the power supply voltage Vdd. Meanwhile, of two memory elements 10 connected to the row wiring line $RL_2$, the memory element 10 connected to the wiring line $C_1$ is put into a high-resistance state, and the memory element 10 connected to the wiring line $C_2$ is put into a low-resistance state, so that the potential of the row wiring line $RL_2$ becomes equal to the potential of the ground voltage Vss.

As described above, even if the memory elements in the look-up table circuit 103A1 of the first modification include a memory element in a defective condition, a spare memory element is used so that the look-up table circuit 103A1 can be made to operate properly. Thus, the chip yield can be made higher than that in a case where the look-up table circuit 103 shown in FIG. 5 is used. That is, it is possible to provide a reconfigurable circuit including a look-up table circuit that can reduce the defect rate.

Second Modification

Figure 7B:
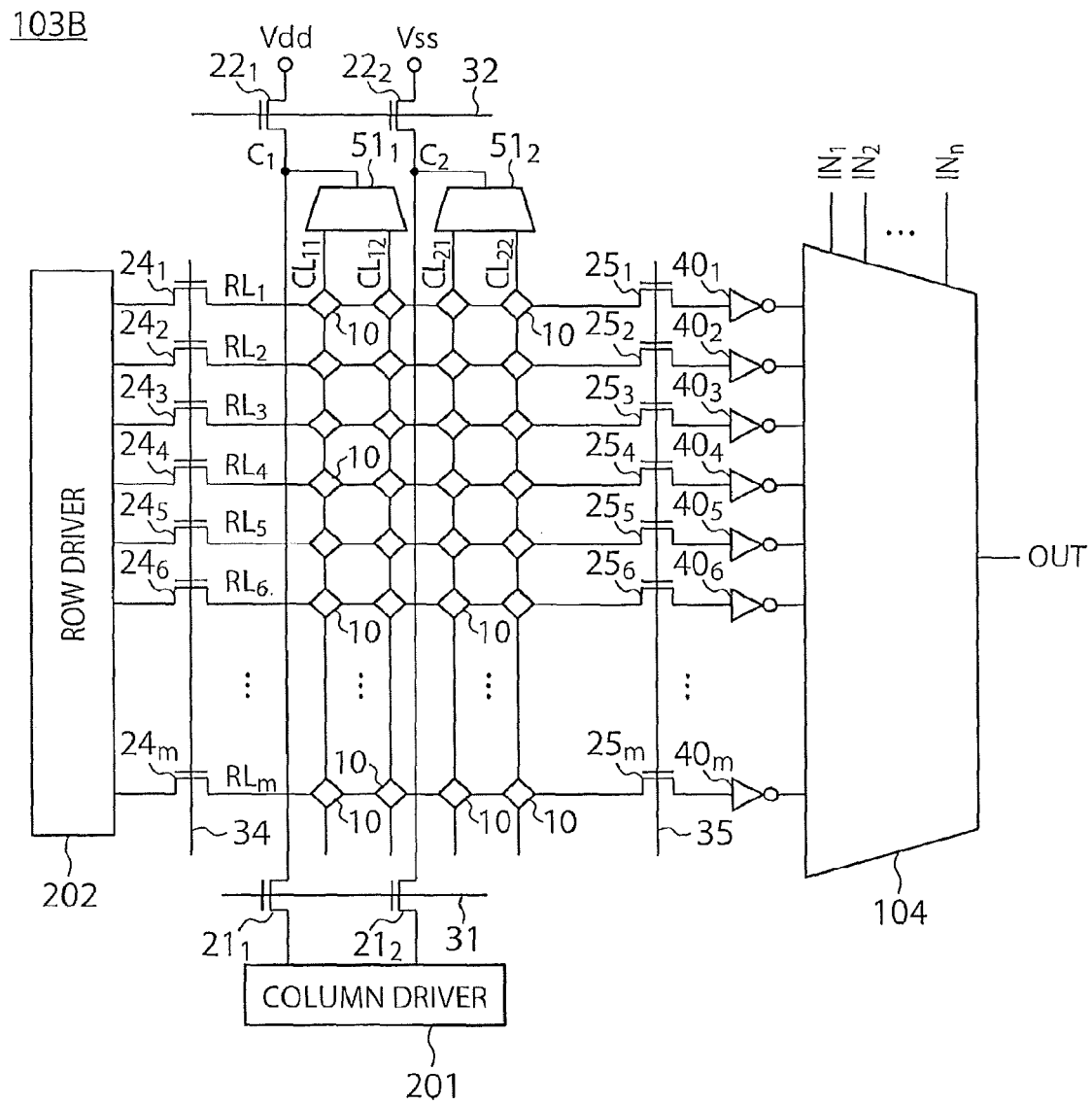
FIG. 7B is a diagram showing a look-up table circuit of a second modification of the first embodiment.

FIG. 7B shows a look-up table circuit according to a second modification. A look-up table circuit 103B of the second modification is the same as the look-up table circuit 103A1 of the first modification shown in FIG. 7A, except that transistors 21₁ and 21₂ are disposed between the column driver 201 and the wiring lines $C_1$ and $C_2$, respectively, a transistor 22₁ is disposed between the wiring line $C_1$ and the first voltage supply that generates the power supply voltage Vdd, a transistor 22₂ is disposed between the wiring line $C_2$ and the second voltage supply that generates the ground voltage Vss, transistors $24_1$ through $24_m$ are disposed between the row driver 202 and the row wiring lines $RL_1$ through $RL_m$, and transistors $25_1$ through $25_m$ and inverters (or buffers) $40_1$ through $40_m$ are disposed between the row wiring lines $RL_1$ through $RL_m$ and the multiplexer 104. In FIG. 7B, the wiring line $C_1$ is connected to the first voltage supply Vdd via the transistor $22_1$, and the wiring line $C_2$ is connected to the second voltage supply Vss via the transistor $22_2$. However, the wiring line $C_1$ may be connected to the second voltage supply Vss via the transistor $22_1$, and the wiring line $C_2$ may be connected to the first voltage supply Vdd via the transistor $22_2$.

The respective gates of the transistors $21_1$ and $21_2$ are connected to a control line 31. The respective gates of the transistors $22_1$ and $22_2$ are connected to a control line 32. The respective gates of the transistors $24_1$ through $24_m$ are connected to a control line 34. The respective gates of the transistors $25_1$ through $25_m$ are connected to a control line 35. These transistors $21_1$, $21_2$, $22_1$, $22_2$, $24_1$ through $24_m$, and $25_1$ through $25_m$ may be n-channel transistors, or may be p-channel transistors.

As the transistors $22_1$ and $22_2$ are disposed as described above, the first voltage supply and the second voltage supply can be separated from the memory elements 10 when writing is performed. As the transistors $21_1$, $21_2$, and $24_1$ through $24_m$ are disposed, the column driver 201 and the row driver 202 can be separated from the memory elements 10 when the look-up table circuit is made to operate. As the transistors $25_1$ through $25_m$ are disposed, the multiplexer 104 and the inverters $40_1$ through $40_m$ can be prevented from being damaged when writing is performed. As the inverters $40_1$ through $40_m$ are disposed, the operating speed of the look-up table circuit can be increased.

Like the first modification, the second modification can also provide an Integrated circuit including a look-up table circuit that can reduce the defect rate.

Second Embodiment

Figure 8A:
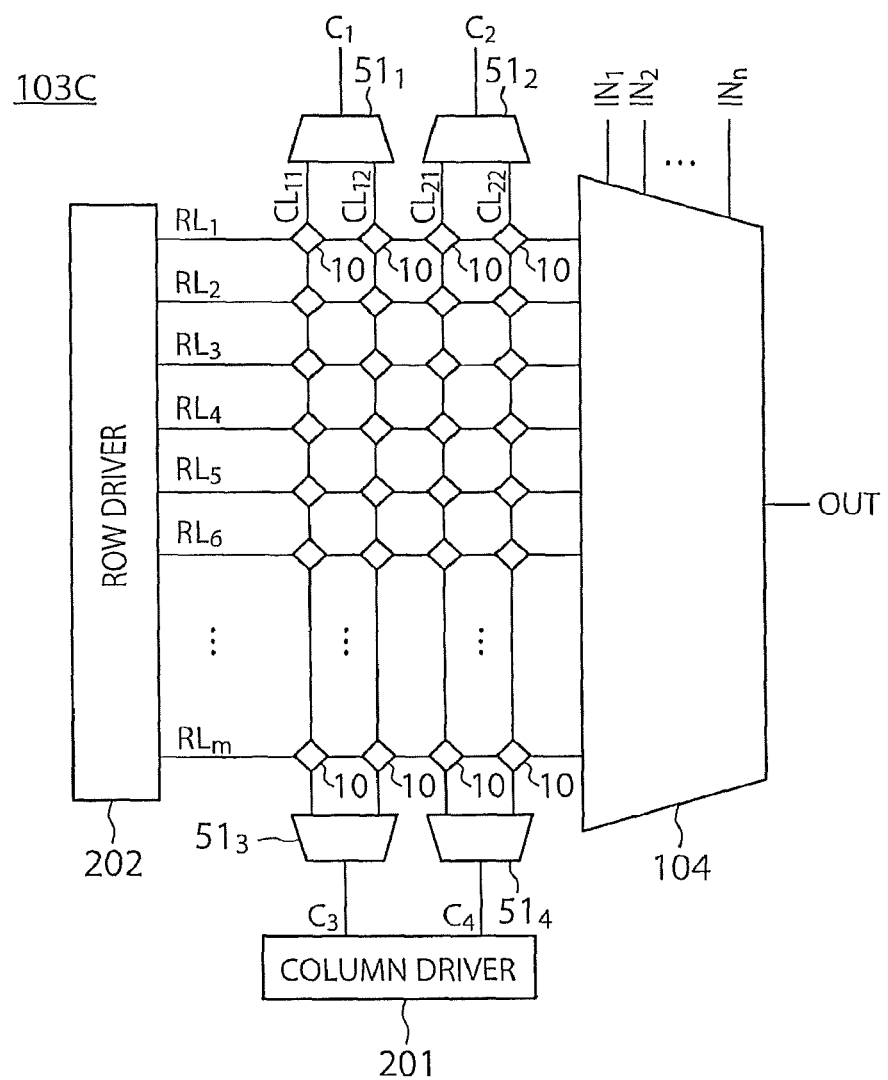
FIG. 8A is a diagram showing a look-up table circuit of a second embodiment.

Referring now to FIG. 8A, an integrated circuit according to a second embodiment is described. The Integrated circuit of the second embodiment includes a look-up table circuit 103C shown in FIG. 8A. The look-up table circuit 103C according to the second embodiment includes n select lines $IN_1$ through $IN_n$, an output line OUT, a select circuit 104, four wiring lines $C_1$, $C_2$, $C_3$, and $C_4$, four column wiring lines $CL_{11}$, $CL_{12}$, $CL_{21}$, and $CL_{22}$, m (≥1) row wiring lines $RL_1$ through $RL_m$, memory elements 10 disposed in the intersection regions between the column wiring lines and the row wiring lines, and switch circuits $51_1$, $51_2$, $51_3$, and $51_4$. Each of these memory elements 10 is one of the resistive change elements shown in FIGS. 2 through 3B, for example. In the second embodiment, the two switch circuits $51_1$ and $51_2$ may be replaced with a select circuit, and the two switch circuits $51_3$ and $51_4$ may be replaced with another select circuit, as in the first embodiment shown in FIG. 6.

These resistive change elements 10 are disposed in the Intersection regions between the four column wiring lines $CL_{11}$, $CL_{12}$, $CL_{21}$, and $CL_{22}$, and the m (≥1) row wiring lines $RL_1$ through $RL_m$, as in the first embodiment. In a resistive change element 10, one of the two electrodes (or two terminals) is connected to the one of the four column wiring lines $CL_{11}$, $CL_{12}$, $CL_{21}$, and $CL_{22}$ corresponding to the intersection region in which the resistive change element 10 is disposed, and the other one of the two electrodes (or two terminals) is connected to the one of the m (≥1) row wiring lines $RL_1$ through $RL_m$ corresponding to the intersection region in which the resistive change element 10 is disposed.

One of the column wiring lines $CL_{11}$ and $CL_{12}$ is connected to the wiring line $C_1$ via the switch circuit $51_1$, and one of the column wiring lines $CL_{21}$ and $CL_{22}$ is connected to the wiring line $C_2$ via the switch circuit $51_2$. Also, one of the column wiring lines $CL_{11}$ and $CL_{12}$ is connected to the wiring line $C_3$ via the switch circuit $51_3$, and one of the column wiring lines $CL_{21}$ and $CL_{22}$ is connected to the wiring line $C_4$ via the switch circuit $51_4$. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss. The wiring lines $C_3$ and $C_4$ are connected to a column driver 201.

In the look-up table circuit 103C of the second embodiment, the switch circuits $51_1$ and $51_2$ connect the column wiring lines not having any defective memory element connected thereto, to the wiring lines $C_1$ and $C_2$, respectively, as in the first embodiment. The switch circuits $51_3$ and $51_4$ also select the column wiring lines not having any defective memory element connected thereto, and connect the selected column wiring lines to the wiring lines $C_3$ and $C_4$, respectively. The switch circuits $51_1$ and $51_3$ select the same column wiring line, and the switch circuits $51_2$ and $51_4$ select the same column wiring line.

In this embodiment, the row wiring lines $RL_1$ through $RL_m$ are connected to a row driver 202 and the input terminals of the select circuit 104, as in the first embodiment.

In the second embodiment designed as above, even if the memory elements in the look-up table circuit include a memory element in a defective condition, only memory elements not in a defective condition are selected and used, so that the circuit can be made to operate properly.

In the second embodiment, different switch circuits are used at a time of rewriting a memory element and at a time of a circuit operation. Specifically, when the Information in a selected memory element 10 is rewritten, the voltage from the column driver 201 is applied to the selected memory element 10 via the switch circuits $51_3$ and $51_4$. When the look-up table circuit is in operation, on the other hand, the power supply voltage Vdd and the ground voltage Vss are applied to memory elements 10 via the switch circuits $51_1$ and $51_2$.

To rewrite a memory element, a write voltage that is higher than the power supply voltage is normally required. However, if such a high voltage is applied to a switch circuit, the switch circuit might be damaged. In the first modification of the first embodiment shown in FIG. 7A, the same switch circuit is used at a time of rewriting a memory element and at a time of an operation of the look-up table circuit. Therefore, even if the switch circuit is damaged by the write voltage, the switch circuit will be used after the write operation. The degree of damage will become higher over long-time operation, and the elements constituting the switch circuit might be broken.

In the second embodiment, on the other hand, the write voltage is applied to the switch circuits $51_3$ and $51_4$ only when a selected memory element is rewritten, and any voltage is not applied to the switch circuits $51_3$ and $51_4$ during a normal circuit operation of the look-up table circuit. Even in a case where the switch circuits $51_3$ and $51_4$ are damaged due to rewriting of a memory element, the other switch circuits $51_1$ and $51_2$ are used in the operation of the look-up table circuit, and the elements constituting the switch circuits will not be broken during the operation of the look-up table circuit.

As described above, the second embodiment can also provide an Integrated circuit including a look-up table circuit that can reduce the defect rate, like the first embodiment.

Figure 8B:
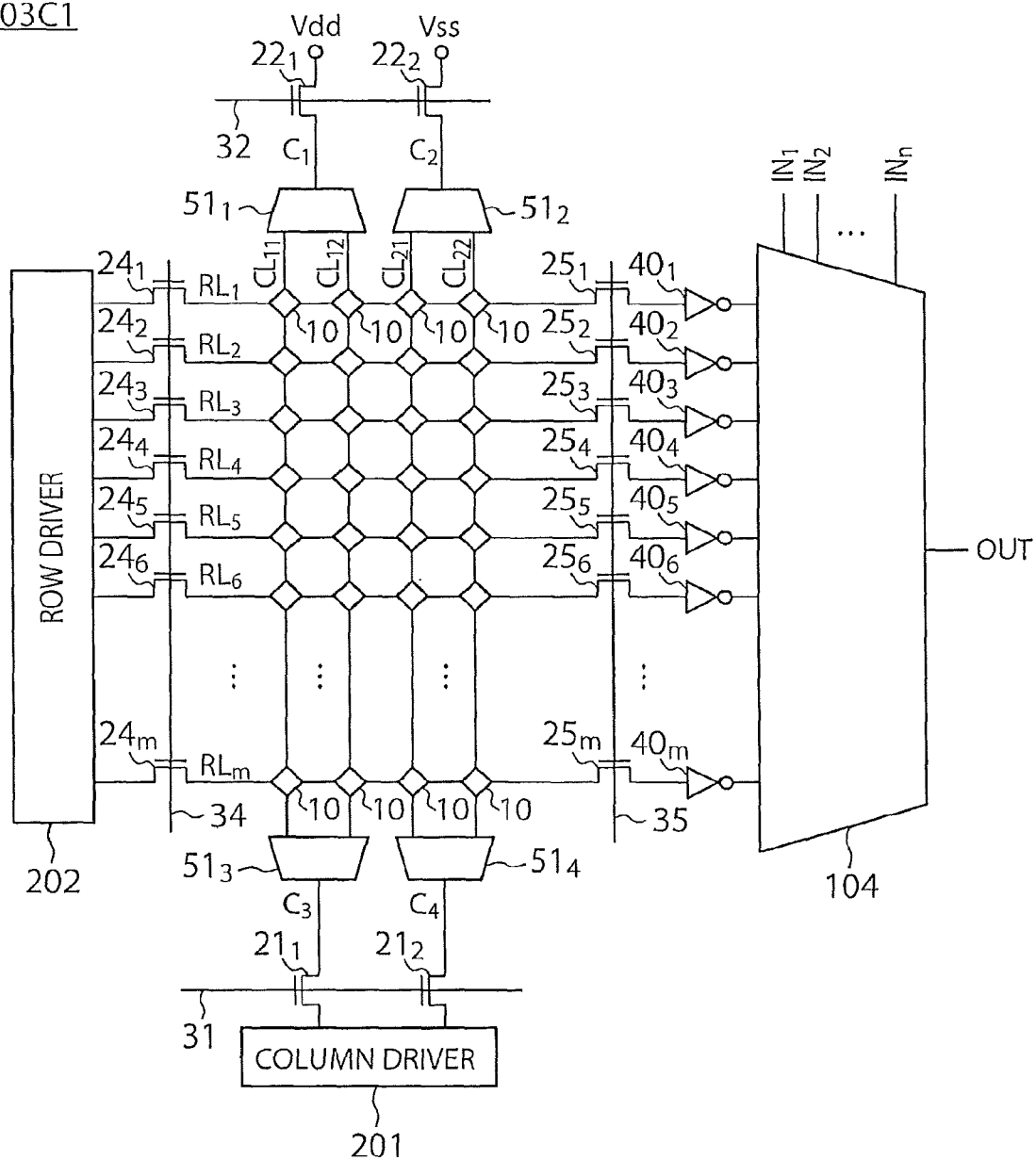
FIG. 8B is a diagram showing a look-up table circuit of a modification of the second embodiment.

In the second embodiment shown in FIG. 8A, transistors may be disposed between the column driver 201 and the wiring lines $C_3$ and $C_4$, between the row driver 202 and the row wiring lines $RL_1$ through $RL_m$, between the row wiring lines $RL_1$ through $RL_m$ and the multiplexer 104, between the wiring line $C_1$ and the first voltage supply that generates the power supply voltage Vdd, and between the wiring line $C_2$ and the second voltage supply that generates the ground voltage Vss, as in the second modification of the first embodiment shown in FIG. 7B. This modification is shown as a look-up table circuit 103C1 in FIG. 8B. Further, inverters (or buffers) may be disposed between the row wiring lines $RL_1$ through $RL_m$ and the multiplexer 104.

Third Embodiment

Figure 9:
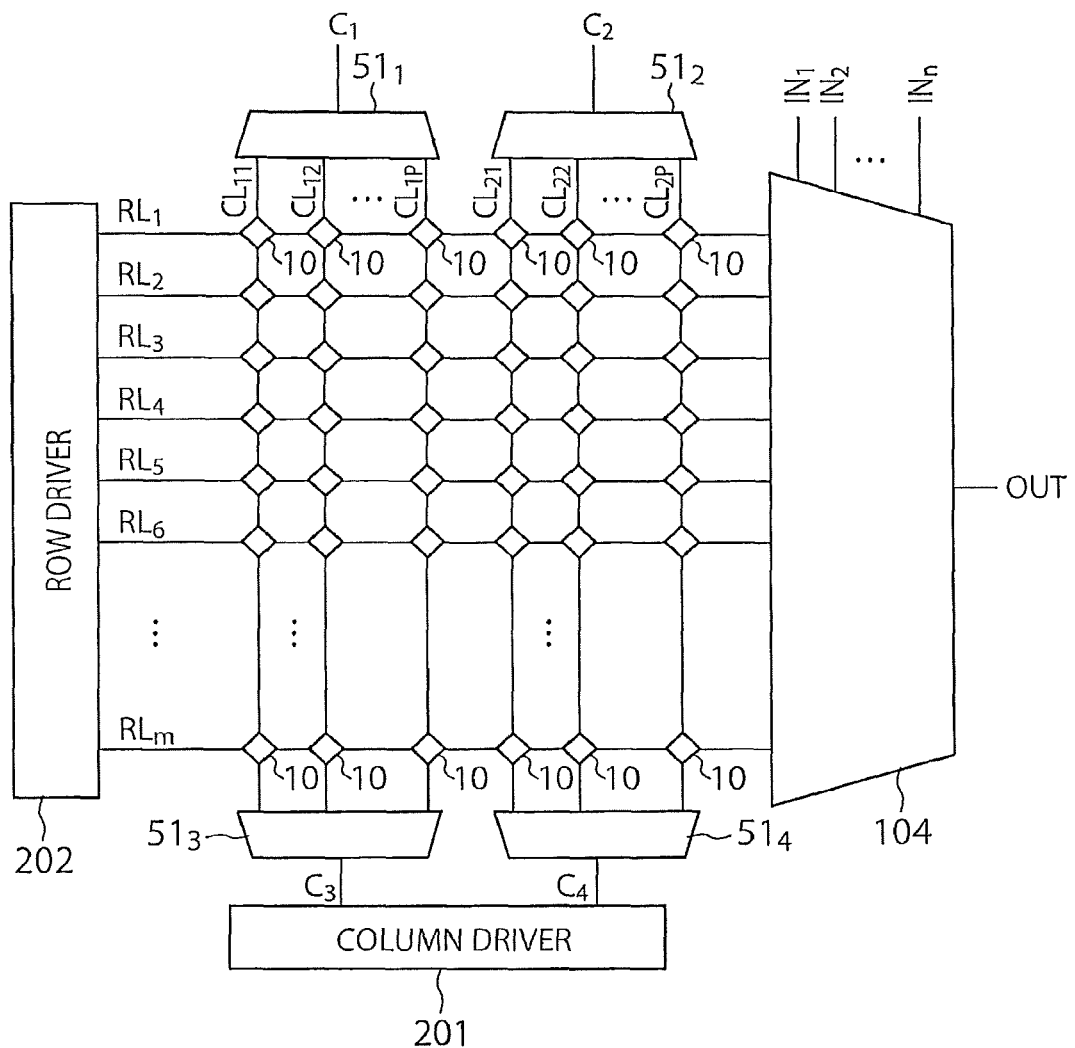
FIG. 9 is a diagram showing a look-up table circuit of a third embodiment.

Referring now to FIG. 9, an integrated circuit according to a third embodiment is described. The Integrated circuit of the third embodiment includes a look-up table circuit 103D shown in FIG. 9. The look-up table circuit 103D according to the third embodiment includes n select lines $IN_1$ through $IN_n$, an output line OUT, a multiplexer 104, four wiring lines $C_1$, $C_2$, $C_3$, and $C_4$, 2p (p≥3) column wiring lines $CL_{11}$, $CL_{12}$, ..., $CL_{1p}$, $CL_{21}$, $CL_{22}$, ..., and $CL_{2p}$, m (≥1) row wiring lines $RL_1$ through $RL_m$, memory elements 10 disposed at the Intersection points between the column wiring lines and the row wiring lines, and switch circuits $51_1$, $51_2$, $51_3$, and $51_4$. Each of these memory elements 10 is one of the resistive change elements shown in FIGS. 2 through 3B, for example. In the third embodiment, the two switch circuits $51_1$ and $51_2$ may be replaced with a select circuit, and the two switch circuits $51_3$ and $51_4$ may be replaced with another select circuit, as in the first embodiment shown in FIG. 6.

These resistive change elements 10 are disposed in the Intersection regions between the 2p column wiring lines $CL_{11}$, $CL_{12}$, ..., $CL_{1p}$, $CL_{21}$, $CL_{22}$, ..., and $CL_{2p}$, and the m (≥1) row wiring lines $RL_1$ through $RL_m$, as in the first embodiment. In a resistive change element 10, one of the two electrodes (or two terminals) is connected to the one of the 2p column wiring lines $CL_{11}$, $CL_{12}$, ..., $CL_{1p}$, $CL_{21}$, $CL_{22}$, ..., and $CL_{2p}$ corresponding to the intersection region in which the resistive change element 10 is disposed, and the other one of the two electrodes (or two terminals) is connected to the one of the m (≥1) row wiring lines $RL_1$ through $RL_m$ corresponding to the Intersection region in which the resistive change element 10 is disposed.

In the third embodiment, one of the column wiring lines $CL_{11}$ through $CL_{1p}$ is connected to the wiring line $C_1$ via the switch circuit $51_1$, and one of the column wiring lines $CL_{21}$ through $CL_{2p}$ is connected to the wiring line $C_2$ via the switch circuit $51_2$. Also, one of the column wiring lines $CL_{11}$ through $CL_{1p}$ is connected to the wiring line $C_3$ via the switch circuit $51_3$, and one of the column wiring lines $CL_{21}$ through $CL_{2p}$ is connected to the wiring line $C_4$ via the switch circuit $51_4$. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss. The wiring lines $C_3$ and $C_4$ are connected to a column driver 201.

The switch circuits $51_1$ and $51_2$ connect the column wiring lines not having any defective memory element connected thereto, to the wiring lines $C_1$ and $C_2$, respectively, as in the second embodiment shown in FIG. 8A. The switch circuits $51_3$ and $51_4$ also connect the column wiring lines not having any defective memory element connected thereto, to the wiring lines $C_3$ and $C_4$, respectively. The switch circuit $51_1$ and the switch circuit $51_3$ select the same column wiring line, and the switch circuit $51_2$ and the switch circuit $51_4$ select the same column wiring line.

In this embodiment, the row wiring lines $RL_1$ through $RL_m$ are connected to a row driver 202 and the Input terminals of the select circuit 104, as in the first embodiment.

In this embodiment, the column wiring lines $CL_{12}$ through $CL_{1p}$ can be regarded as spares of the column wiring line $CL_{11}$. Likewise, the column wiring lines $CL_{22}$ through $CL_{2p}$ can be regarded as spares of the column wiring line $CL_{21}$. As this embodiment involves a larger number of spares than the second embodiment shown in FIG. 8A, the recovery rate in cases where the memory elements in the look-up table circuit include a memory element in a defective condition can be further increased.

As described above, the third embodiment can also provide a reconfigurable circuit including a look-up table circuit that can reduce the defect rate, like the second embodiment.

In the third embodiment shown in FIG. 9, transistors may be disposed between the column driver 201 and the wiring lines $C_3$ and $C_4$, between the row driver 202 and the row wiring lines $RL_1$ through $RL_m$, between the row wiring lines $RL_1$ through $RL_m$ and the multiplexer 104, between the wiring line $C_1$ and the first voltage supply, and between the wiring line $C_2$ and the second voltage supply, as in the second modification of the first embodiment shown in FIG. 7B. Further, inverters (or buffers) may be disposed between the row wiring lines $RL_1$ through $RL_m$ and the multiplexer 104.

Fourth Embodiment

Figure 10:
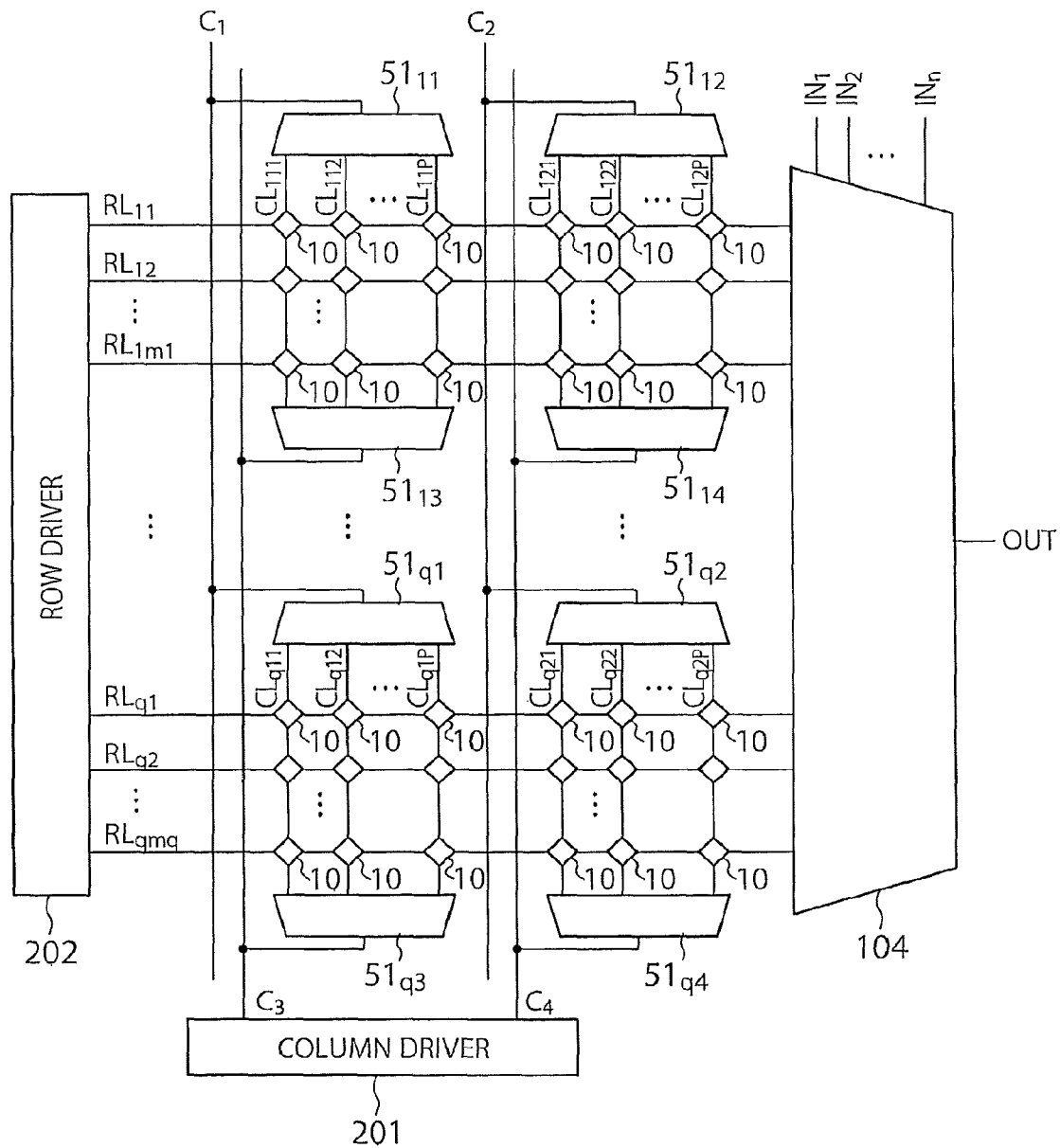
FIG. 10 is a diagram showing a look-up table circuit of a fourth embodiment.

Referring now to FIG. 10, an integrated circuit according to a fourth embodiment is described. The integrated circuit of the fourth embodiment includes a look-up table circuit 103E shown in FIG. 10. In the fourth embodiment, q and $m_1$ through $m_q$ are natural numbers, and $m=m_1+ \ldots +m_q$. The look-up table circuit 103E of the fourth embodiment is the same as the look-up table circuit 103D of the third embodiment shown in FIG. 9, except that the m row wiring lines $RL_1$ through $RL_m$ are divided into q row wiring line groups $RL_{11}$ through $RL_{1m1}$, $RL_{21}$ through $RL_{2m2}$, ..., and $RL_{q1}$ through $RL_{qmq}$, 2p column wiring lines are disposed for each row wiring line group, and switch circuits $51_1$, $51_2$, $51_3$, and $51_4$ are disposed for each row wiring line group.

Specifically, the look-up table circuit 103E according to the fourth embodiment includes n select lines $IN_1$ through $IN_n$, an output line OUT, a multiplexer 104, four wiring lines $C_1$, $C_2$, $C_3$, and $C_4$, q row wiring line groups $RL_{11}$ through $RL_{1m1}$, $RL_{21}$ through $RL_{2m2}$, ..., and $RL_{q1}$ through $RL_{qmq}$, 2p (p≥1) column wiring lines $CL_{i11}$ through $CL_{i1p}$ and $CL_{i21}$ through $CL_{i2p}$ corresponding to the respective groups of the q row wiring line groups $RL_{i1}$ through $RL_{imi}$ (i=1, ..., q), memory elements 10 disposed in the intersection regions between the row wiring lines of the respective groups of the q row wiring line groups $RL_{i1}$ through $RL_{imi}$ (i=1, ..., q) and the corresponding column wiring lines $CL_{i11}$ through $CL_{i1p}$ and $CL_{i21}$ through $CL_{i2p}$, and 4q switch circuits $51_{11}$, $51_{12}$, $51_{13}$, $51_{14}$, ..., $51_{q1}$, $51_{q2}$, $51_{q3}$, and $51_{q4}$. Each of these memory elements 10 is one of the resistive change elements shown in FIGS. 2 through 3B, for example. Four of the 4q switch circuits are disposed for each of the q row wiring line groups $RL_{i1}$ through $RL_{imi}$ (1≤i≤q). In the fourth embodiment, the two switch circuits $51_{i1}$ and $51_{i2}$ (=1, 2, ..., q) may be replaced with a select circuit, and the two switch circuits $51_{i3}$ and $51_{i4}$ (i=1, 2, ..., q) may be replaced with another select circuit, as in the first embodiment shown in FIG. 6.

In each of these resistive change elements 10, one of the two electrodes (or two terminals) is connected to the one of the 2pq column wiring lines $CL_{i11}$ through $CL_{i1p}$ and $CL_{i21}$ through $CL_{i2p}$ (i=1, ..., q) corresponding to the intersection region, and the other one of the two electrodes (or two terminals) is connected to the one of the m (≥1) row wiring lines $RL_{i1}$ through $RL_{imi}$ (i=1, ..., q) corresponding to the intersection region, as in the first embodiment.

The switch circuit $51_{i1}$ (i=1, ..., q) selects one column wiring line to which any defective memory element 10 is not connected from among the column wiring lines $CL_{i11}$ through $CL_{i1p}$, and connects the selected column wiring line to the wiring line $C_1$. The switch circuit $51_{i2}$ (i=1, ..., q) selects one column wiring line to which any defective memory element 10 is not connected from among the column wiring lines $CL_{i21}$ through $CL_{i2p}$, and connects the selected column wiring line to the wiring line $C_2$. The switch circuit $51_{i3}$ (i=1, ..., q) selects one column wiring line to which any defective memory element 10 is not connected from among the column wiring lines $CL_{i11}$ through $CL_{i1p}$, and connects the selected column wiring line to the wiring line $C_3$. The switch circuit $51_{i4}$ (i=1, ..., q) selects one column wiring line to which any defective memory element 10 is not connected from among the column wiring lines $CL_{i21}$ through $CL_{i2p}$, and connects the selected column wiring line to the wiring line $C_4$. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss. The wiring lines $C_3$ and $C_4$ are connected to a column driver 201.

The switch circuit $51_{i1}$ (i=1, ..., q) and the switch circuit $51_{i3}$ select the same column wiring line, and the switch circuit $51_{i2}$ (i=1, ..., q) and the switch circuit $51_{i4}$ select the same column wiring line.

In this embodiment, the row wiring lines $RL_1$ through $RL_m$ are connected to a row driver 202 and the input terminals of the multiplexer 104, as in the third embodiment.

In the look-up table circuit of the third embodiment shown in FIG. 9, as the number m of row wiring lines becomes larger, the probability that no memory elements are in a defective condition becomes lower. For example, the switch circuit $51_1$ selects a column wiring line to which any memory element in a defective condition is not connected from among the column wiring lines $CL_{11}$ through $CL_{1p}$, and connects the selected column wiring line to the wiring line $C_1$. However, in a case where one or more memory elements connected to any column wiring line of the column wiring lines $CL_{11}$ through $CL_{1p}$ are in a defective condition, the switch circuit $51_1$ cannot select any column wiring line, and the look-up table circuit of the third embodiment cannot be used. Therefore, the recovery rate in the look-up table circuit becomes lower, as the number m of row wiring lines becomes larger.

In the look-up table circuit of this embodiment shown in FIG. 10, on the other hand, the row wiring lines are divided into row wiring line groups, and accordingly, even if the total number of row wiring lines is large, the number of row wiring lines in each group is small. Thus, the recovery rate in cases where a defective memory element exists becomes higher.

As described above, the fourth embodiment can also provide an integrated circuit including a look-up table circuit that can reduce the defect rate, like the third embodiment.

In the fourth embodiment shown in FIG. 10, transistors may be disposed between the column driver 201 and the wiring lines $C_3$ and $C_4$, between the row driver 202 and the row wiring lines $RL_1$ through $RL_m$, between the row wiring lines $RL_1$ through $RL_m$ and the multiplexer 104, between the wiring line $C_1$ and the first voltage supply, and between the wiring line $C_2$ and the second voltage supply, as in the second modification of the first embodiment shown in FIG. 7B. Further, inverters (or buffers) may be disposed between the row wiring lines $RL_1$ through $RL_m$ and the multiplexer 104.

Fifth Embodiment

Figure 11:
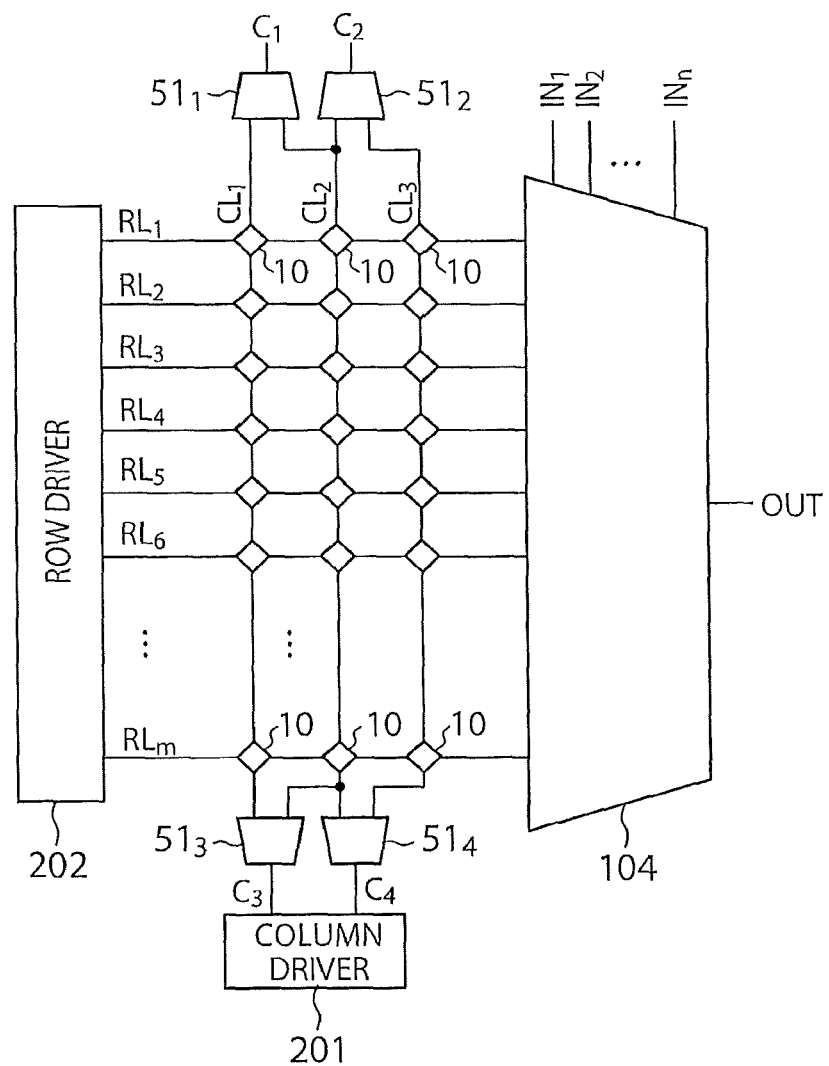
FIG. 11 is a diagram showing a look-up table circuit of a fifth embodiment.

Referring now to FIG. 11, an integrated circuit according to a fifth embodiment is described. The Integrated circuit of the fifth embodiment includes a look-up table circuit 103F shown in FIG. 11. The look-up table circuit 103F of the fifth embodiment is the same as the look-up table circuit 103C of the second embodiment shown in FIG. 8A, except that the column wiring line $CL_{11}$ is replaced with a column wiring line $CL_1$, the two column wiring lines $CL_{12}$ and $CL_{21}$ are replaced with a column wiring line $CL_2$, and the column wiring line $CL_{22}$ is replaced with a column wiring line $CL_3$.

Specifically, the look-up table circuit 103F according to the fifth embodiment includes n select lines $IN_1$ through $IN_n$, an output line OUT, a multiplexer 104, four wiring lines $C_1$, $C_2$, $C_3$, and $C_4$, m (m≥1) row wiring lines $RL_1$ through $RL_m$, three column wiring lines $CL_1$, $CL_2$, and $CL_3$, memory elements 10 disposed in the intersection regions between the m (m≥1) row wiring lines $RL_1$ through $RL_m$ and the three column wiring lines $CL_1$, $CL_2$, and $CL_3$, and four switch circuits $51_1$, $51_2$, $51_3$, and $51_4$. Each of these memory elements 10 is one of the resistive change elements shown in FIGS. 2 through 3B, for example. In the fifth embodiment, the two switch circuits $51_1$ and $51_2$ may be replaced with a select circuit, and the two switch circuits $51_3$ and $51_4$ may be replaced with another select circuit, as in the first embodiment shown in FIG. 6.

These resistive change elements 10 are disposed in the intersection regions between the three column wiring lines $CL_1$, $CL_2$, and $CL_3$, and the m (≥1) row wiring lines $RL_1$ through $RL_m$, as in the first embodiment. In a resistive change element 10, one of the two electrodes (or two terminals) is connected to the one of the three column wiring lines $CL_1$, $CL_2$, and $CL_3$ corresponding to the Intersection region in which the resistive change element 10 is disposed, and the other one of the two electrodes (or two terminals) is connected to the one of the m (≥1) row wiring lines $RL_1$ through $RL_m$ corresponding to the intersection region in which the resistive change element 10 is disposed.

In the look-up table circuit 103F of the fifth embodiment, one of the column wiring lines $CL_1$ and $CL_2$ is connected to the wiring line $C_1$ via the switch circuit $51_1$, and one of the column wiring lines $CL_2$ and $CL_3$ is connected to the wiring line $C_2$ via the switch circuit $51_2$. However, the switch circuit $51_1$ and the switch circuit $51_2$ do not select the same column wiring line. Also, one of the column wiring lines $CL_1$ and $CL_2$ is connected to the wiring line $C_3$ via the switch circuit $51_3$, and one of the column wiring lines $CL_2$ and $CL_3$ is connected to the wiring line $C_4$ via the switch circuit $51_4$.

However, the switch circuit $51_3$ and the switch circuit $51_4$ do not select the same column wiring line. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss. The wiring lines $C_3$ and $C_4$ are connected to a column driver 201.

In this embodiment, the row wiring lines $RL_1$ through $RL_m$ are connected to a row driver 202 and the Input terminals of the multiplexer 104, as in the second embodiment.

The switch circuits $51_1$ and $51_2$ connect the column wiring lines not having any defective memory element connected thereto, to the wiring lines $C_1$ and $C_2$, respectively, as in the look-up table circuit of the first modification of the first embodiment shown in FIG. 7A. The switch circuits $51_3$ and $51_4$ also connect the column wiring lines not having any defective memory element connected thereto, to the wiring lines $C_3$ and $C_4$, respectively. The switch circuits $51_1$ and $51_3$ select the same column wiring line, and the switch circuits $51_2$ and $51_4$ select the same column wiring line. For example, in a case where the memory elements connected to the column wiring line $CL_1$ include a memory element in a defective condition, the switch circuits $51_1$ and $51_3$ connect the column wiring line $CL_2$ to the wiring lines $C_1$ and $C_3$, and the switch circuits $51_2$ and $51_4$ connect the column wiring line $CL_3$ to the wiring lines $C_2$ and $C_4$. Likewise, in a case where the memory elements connected to the column wiring line $CL_2$ Include a memory element in a defective condition, for example, the switch circuits $51_1$ and $51_3$ connect the column wiring line $CL_1$ to the wiring lines $C_1$ and $C_3$, and the switch circuits $51_2$ and $51_4$ connect the column wiring line $CL_3$ to the wiring lines $C_2$ and $C_4$.

In the fifth embodiment shown in FIG. 11, even if the memory elements in the look-up table circuit include a memory element in a defective condition, only memory elements not in a defective condition are selected and used, so that the look-up table circuit can be made to operate properly.

As described above, the fifth embodiment can also provide an Integrated circuit including a look-up table circuit that can reduce the defect rate, like the second embodiment.

In the fifth embodiment shown in FIG. 11, transistors may be disposed between the column driver 201 and the wiring lines $C_3$ and $C_4$, between the row driver 202 and the row wiring lines $RL_1$ through $RL_m$, between the row wiring lines $RL_1$ through $RL_m$ and the multiplexer 104, between the wiring line $C_1$ and the first voltage supply, and between the wiring line $C_2$ and the second voltage supply, as in the second modification of the first embodiment shown in FIG. 7B. Further, inverters (or buffers) may be disposed between the row wiring lines $RL_1$ through $RL_m$ and the multiplexer 104.

Sixth Embodiment

Figure 12:
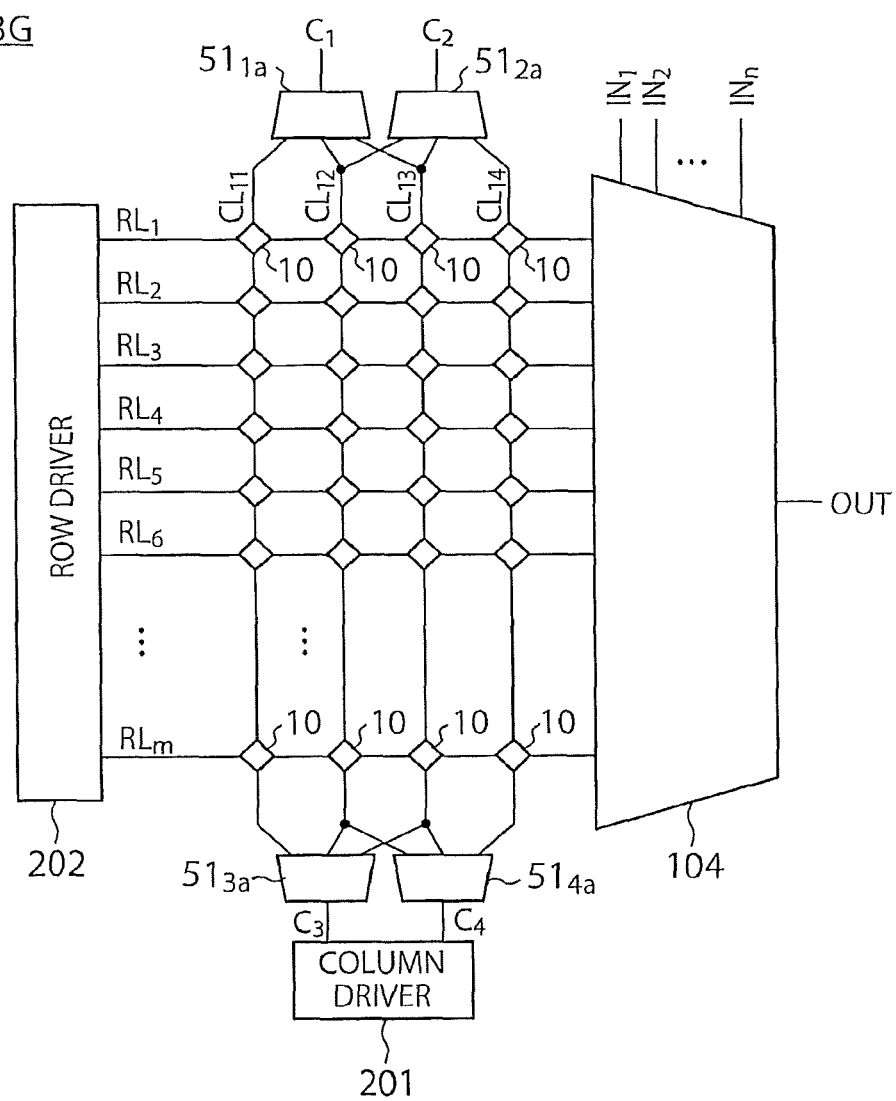
FIG. 12 is a diagram showing a look-up table circuit of a sixth embodiment.

Referring now to FIG. 12, an integrated circuit according to a sixth embodiment is described. The Integrated circuit of the sixth embodiment includes a look-up table circuit 103G shown in FIG. 12. The look-up table circuit 103G of the sixth embodiment is the same as the look-up table circuit 103C of the second embodiment shown in FIG. 8A, except that the switch circuits $51_1$, $51_2$, $51_3$, and $51_4$ are replaced with switch circuits $51_{1a}$, $51_{2a}$, $51_{3a}$, and $51_{4a}$, respectively.

Specifically, the look-up table circuit 103G according to the sixth embodiment includes n select lines $IN_1$ through $IN_n$, an output line OUT, a multiplexer 104, four wiring lines $C_1$, $C_2$, $C_3$, and $C_4$, m (m≥1) row wiring lines $RL_1$ through $RL_m$, four column wiring lines $CL_{11}$, $CL_{12}$, $CL_{13}$, and $CL_{14}$, memory elements 10 disposed in the intersection regions between the m (m≥1) row wiring lines $RL_1$ through $RL_m$ and the four column wiring lines $CL_{11}$, $CL_{12}$, $CL_{13}$, and $CL_{14}$, and four switch circuits $51_{1a}$, $51_{2a}$, $51_{3a}$, and $51_{4a}$. Each of these memory elements 10 is one of the resistive change elements shown in FIGS. 2 through 3B, for example.

In the sixth embodiment, the two switch circuits $51_{1a}$ and $51_{2a}$ may be replaced with a select circuit, and the two switch circuits $51_{3a}$ and $51_{4a}$ may be replaced with another select circuit, as in the first embodiment shown in FIG. 6.

These resistive change elements 10 are disposed in the intersection regions between the four column wiring lines $CL_{11}$, $CL_{12}$, $CL_{13}$, and $CL_{14}$, and the m (≥1) row wiring lines $RL_1$ through $RL_m$, like the resistive change elements 10 in the first embodiment. In a resistive change element 10, one of the two electrodes (or two terminals) is connected to the one of the four column wiring lines $CL_{11}$, $CL_{12}$, $CL_{13}$, and $CL_{14}$ corresponding to the intersection region in which the resistive change element 10 is disposed, and the other one of the two electrodes (or two terminals) is connected to the one of the m (≥1) row wiring lines $RL_1$ through $RL_m$ corresponding to the intersection region in which the resistive change element 10 is disposed.

In the look-up table circuit of the sixth embodiment, one of the column wiring lines $CL_{11}$, $CL_{12}$, and $CL_{13}$ is connected to the wiring line $C_1$ via the switch circuit $51_1$, and one of the column wiring lines $CL_{12}$, $CL_{13}$, and $CL_{14}$ is connected to the wiring line $C_2$ via the switch circuit $51_2$. However, the switch circuit $51_1$ and the switch circuit $51_2$ do not select the same column wiring line.

Also, one of the column wiring lines $CL_{11}$, $CL_{12}$, and $CL_{13}$ is connected to the wiring line $C_3$ via the switch circuit $51_3$, and one of the column wiring lines $CL_{12}$, $CL_{13}$, and $CL_{14}$ is connected to the wiring line $C_4$ via the switch circuit $51_4$. However, the switch circuit $51_3$ and the switch circuit $51_4$ do not select the same column wiring line. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss. The wiring lines $C_3$ and $C_4$ are connected to a column driver 201.

The row wiring lines $RL_1$ through $RL_m$ are connected to a row driver 202 and the input terminals of the select circuit 104, as in the second embodiment.

The switch circuits $51_1$ and $51_2$ connect the column wiring lines not having any defective memory element connected thereto, to the wiring lines $C_1$ and $C_2$, respectively, as in the look-up table circuit of the fifth embodiment shown in FIG. 11. The switch circuits $51_3$ and $51_4$ also connect the column wiring lines not having any defective memory element connected thereto, to the wiring lines $C_3$ and $C_4$, respectively. The switch circuits $51_1$ and $51_3$ select the same column wiring line, and the switch circuits $51_2$ and $51_4$ select the same column wiring line. In an example case, the memory elements connected to the column wiring line $CL_{11}$ include a memory element in a defective condition, and the memory elements connected to the column wiring line $CL_{13}$ include a memory element in a defective condition. In this case, the switch circuits $51_1$ and $51_3$ connect the column wiring line $CL_{12}$ to the wiring lines $C_1$ and $C_3$, and the switch circuits $51_2$ and $51_4$ connect the column wiring line $CL_{14}$ to the wiring lines $C_2$ and $C_4$.

In another example case, the memory elements connected to the column wiring line $CL_{11}$ include a memory element in a defective condition, and the memory elements connected to the column wiring line $CL_{12}$ Include a memory element in a defective condition. In this case, the switch circuits $51_1$ and $51_3$ connect the column wiring line $CL_{13}$ to the wiring lines $C_1$ and $C_3$, and the switch circuits $51_2$ and $51_4$ connect the column wiring line $CL_{14}$ to the wiring lines $C_2$ and $C_4$.

In the sixth embodiment shown in FIG. 12, even if the memory elements in the look-up table circuit include a memory element in a defective condition, only memory elements not in a defective condition are selected and used, so that the look-up table circuit can be made to operate properly. Furthermore, as the number of spare memory element is larger than that in the look-up table circuit of the fifth embodiment shown in FIG. 11, the recovery rate in the look-up table circuit can be increased.

As described above, the sixth embodiment can also provide an integrated circuit including a look-up table circuit that can reduce the defect rate, like the second embodiment.

In the sixth embodiment shown in FIG. 12, transistors may be disposed between the column driver 201 and the wiring lines $C_3$ and $C_4$, between the row driver 202 and the row wiring lines $RL_1$ through $RL_m$, between the row wiring lines $RL_1$ through $RL_m$ and the multiplexer 104, between the wiring line $C_1$ and the first voltage supply, and between the wiring line $C_2$ and the second voltage supply, as in the second modification of the first embodiment shown in FIG. 7B. Further, inverters (or buffers) may be disposed between the row wiring lines $RL_1$ through $RL_m$ and the multiplexer 104.

Seventh Embodiment

Figure 13:
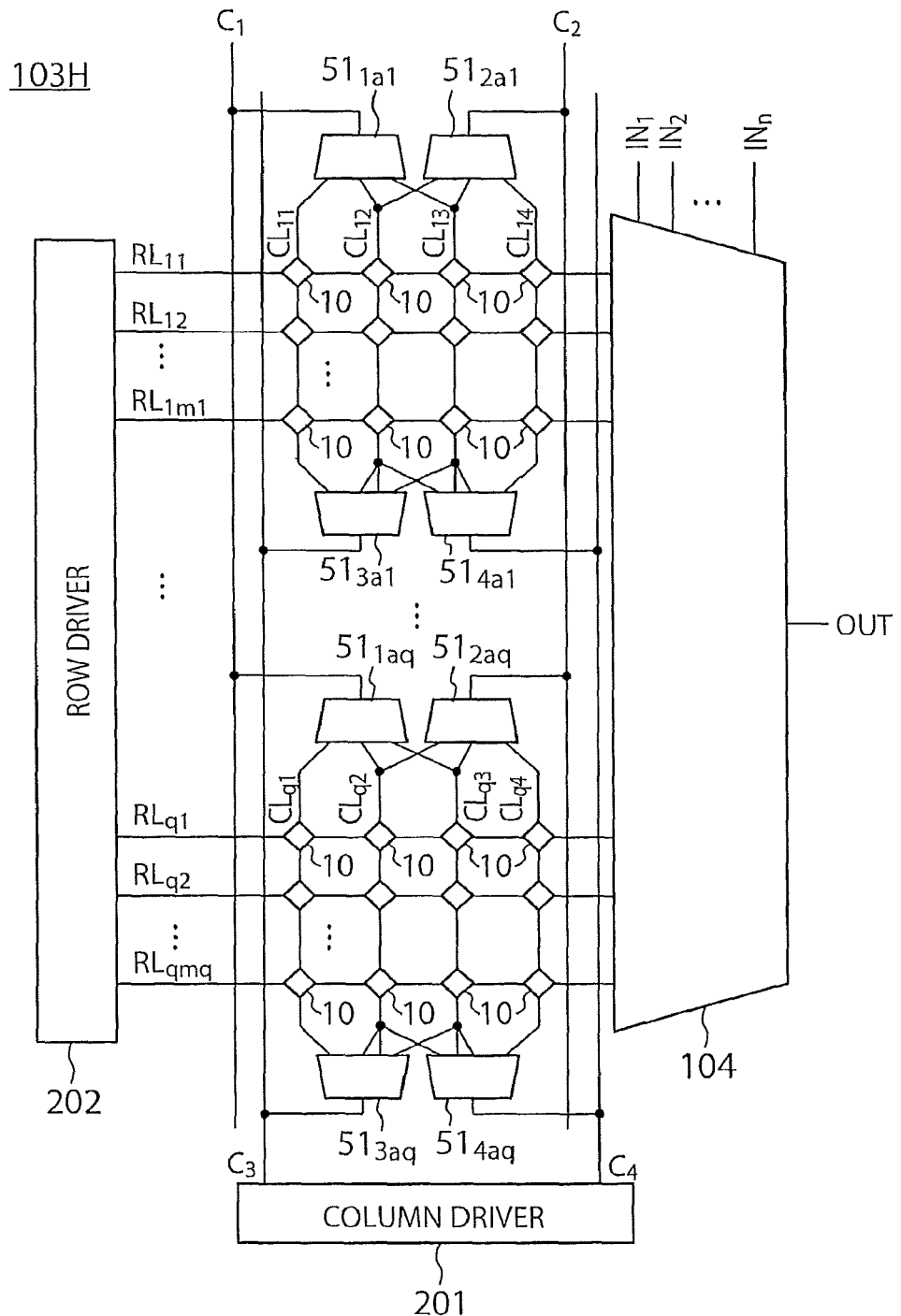
FIG. 13 is a diagram showing a look-up table circuit of a seventh embodiment.

Referring now to FIG. 13, an Integrated circuit according to a seventh embodiment is described. The Integrated circuit of the seventh embodiment includes a look-up table circuit 103H shown in FIG. 13. In the seventh embodiment, q and $m_1$ through $m_q$ are natural numbers, and $m=m_1+ \ldots +m_q$. The look-up table circuit 103H of the seventh embodiment is the same as the look-up table circuit 103G of the sixth embodiment shown in FIG. 12, except that the m row wiring lines $RL_1$ through $RL_m$ are divided into q row wiring line groups $RL_{11}$ through $RL_{1m1}$, $RL_{21}$ through $RL_{2m2}$, ..., and $RL_{q1}$ through $RL_{qmq}$. Four column wiring lines are disposed for each row wiring line group, and the switch circuits $51_{1a}$, $51_{2a}$, $51_{3a}$, and $51_{4a}$ are disposed for each row wiring line group Specifically, the look-up table circuit 103H according to the seventh embodiment includes n select lines $IN_1$ through $IN_n$, an output line OUT, a multiplexer 104, four wiring lines $C_1$, $C_2$, $C_3$, and $C_4$, q row wiring line groups $RL_{11}$ through $RL_{1m1}$, $RL_{21}$ through $RL_{2m2}$, ..., and $RL_{q1}$ through $RL_{qmq}$, four column wiring lines $CL_{i1}$ through $CL_{i4}$ disposed for each of the q row wiring line groups $RL_{i1}$ through $RL_{imi}$ (i=1, ..., q), memory elements 10 disposed in the intersection regions between the row wiring lines of the respective groups of the q row wiring line groups $RL_{i1}$ through $RL_{imi}$ (i=1, ..., q) and the corresponding column wiring lines $CL_{i1}$ through $CL_{i4}$, and 4q switch circuits $51_{1a1}$, $51_{2a1}$, $51_{3a1}$, $51_{4a1}$, ..., $51_{1aq}$, $51_{2aq}$, $51_{3aq}$, and $51_{4aq}$. Each of these memory elements 10 is one of the resistive change elements shown in FIGS. 2 through 3B, for example. The 4q switch circuits are disposed for the q respective row wiring line groups $RL_{i1}$ through $RL_{imi}$ (1≤i≤q). In the seventh embodiment, the two switch circuits $51_{1ai}$ and $51_{2ai}$ (i=1, 2, ..., q) may be replaced with a select circuit, and the two switch circuits $51_{3ai}$ and $51_{4ai}$ (i=1, 2, ..., q) may be replaced with another select circuit, as in the first embodiment shown in FIG. 6.

In each of these resistive change elements 10, one of the two electrodes (or two terminals) is connected to the one of the 4q column wiring lines $CL_{i1}$, $CL_{i2}$, $CL_{i3}$, and $CL_{i4}$ (i=1, ..., q) corresponding to the intersection region, and the other one of the two electrodes (or two terminals) is connected to the one of the m (≥1) row wiring lines $RL_{i1}$ through $RL_{imi}$ (i=1, ..., q) corresponding to the Intersection region, as in each resistive change element 10 of the first embodiment.

The switch circuit $51_{1ai}$ (i=1, ..., q) selects one column wiring line to which any defective memory element 10 is not connected from among the column wiring lines $CL_{i1}$, $CL_{i2}$, and $CL_{i3}$, and connects the selected column wiring line to the wiring line $C_1$. The switch circuit $51_{2ai}$ (i=1, ..., q) selects one column wiring line to which any defective memory element 10 is not connected from among the column wiring lines $CL_{i2}$, $CL_{i3}$, and $CL_{i4}$, and connects the selected column wiring line to the wiring line $C_2$. The switch circuit $51_{3ai}$ (i=1, ..., q) selects one column wiring line to which any defective memory element 10 is not connected from among the column wiring lines $CL_{i1}$, $CL_{i2}$, and $CL_{i3}$, and connects the selected column wiring line to the wiring line $C_3$. The switch circuit $51_{4ai}$ (i=1, ..., q) selects one column wiring line to which any defective memory element 10 is not connected from among the column wiring lines $CL_{i2}$, $CL_{i3}$, and $CL_{i4}$, and connects the selected column wiring line to the wiring line $C_4$. One of the wiring lines $C_1$ and $C_2$ is connected to a first voltage supply that generates a power supply voltage Vdd, and the other one of the wiring lines $C_1$ and $C_2$ is connected to a second voltage supply that generates a ground voltage Vss. The wiring lines $C_3$ and $C_4$ are connected to a column driver 201.

The switch circuit $51_{1ai}$ (i=1, ..., q) and the switch circuit $51_{3ai}$ select the same column wiring line, and the switch circuit $51_{2ai}$ (i=1, ..., q) and the switch circuit $51_{4ai}$ select the same column wiring line.

In this embodiment, the row wiring lines $RL_1$ through $RL_m$ are connected to a row driver 202 and the input terminals of the select circuit 104, as in the third embodiment.

In the look-up table circuit 103G of the sixth embodiment shown in FIG. 12, as the number m of row wiring lines becomes larger, the probability that no memory elements are in a defective condition becomes lower, and the recovery rate in the look-up table circuit becomes lower, accordingly.

In the look-up table circuit 103H of this embodiment shown in FIG. 13, on the other hand, the row wiring lines are divided into row wiring line groups, and accordingly, even if the total number of row wiring lines is large, the number of row wiring lines in each group is small. Thus, the recovery rate in cases where a defective memory element exists becomes higher.

In the seventh embodiment shown in FIG. 13, even if the memory elements in the look-up table circuit include a memory element in a defective condition, only memory elements not in a defective condition are selected and used, so that the look-up table circuit can be made to operate properly. Furthermore, as the number of spare memory element is larger than that in the look-up table circuit of the fifth embodiment shown in FIG. 11, the recovery rate in the look-up table circuit can be increased.

As described above, the seventh embodiment can also provide an integrated circuit including a look-up table circuit that can reduce the defect rate, like the sixth embodiment.

In the seventh embodiment, transistors may be disposed between the column driver 201 and the wiring lines $C_3$ and $C_4$, between the row driver 202 and the row wiring lines $RL_1$ through $RL_m$, between the row wiring lines $RL_1$ through $RL_m$ and the multiplexer 104, between the wiring line $C_1$ and the first voltage supply, and between the wiring line $C_2$ and the second voltage supply, as in the second modification of the first embodiment shown in FIG. 7B. Further, inverters (or buffers) may be disposed between the row wiring lines $RL_1$ through $RL_m$ and the multiplexer 104.

Eighth Embodiment

The look-up table circuits according to the first through seventh embodiments each have two or more spare memory elements in the array direction of the column wiring lines. A look-up table circuit having two or more spare memory elements in the array direction of row wiring lines is described below as an eighth embodiment.

Figure 14:
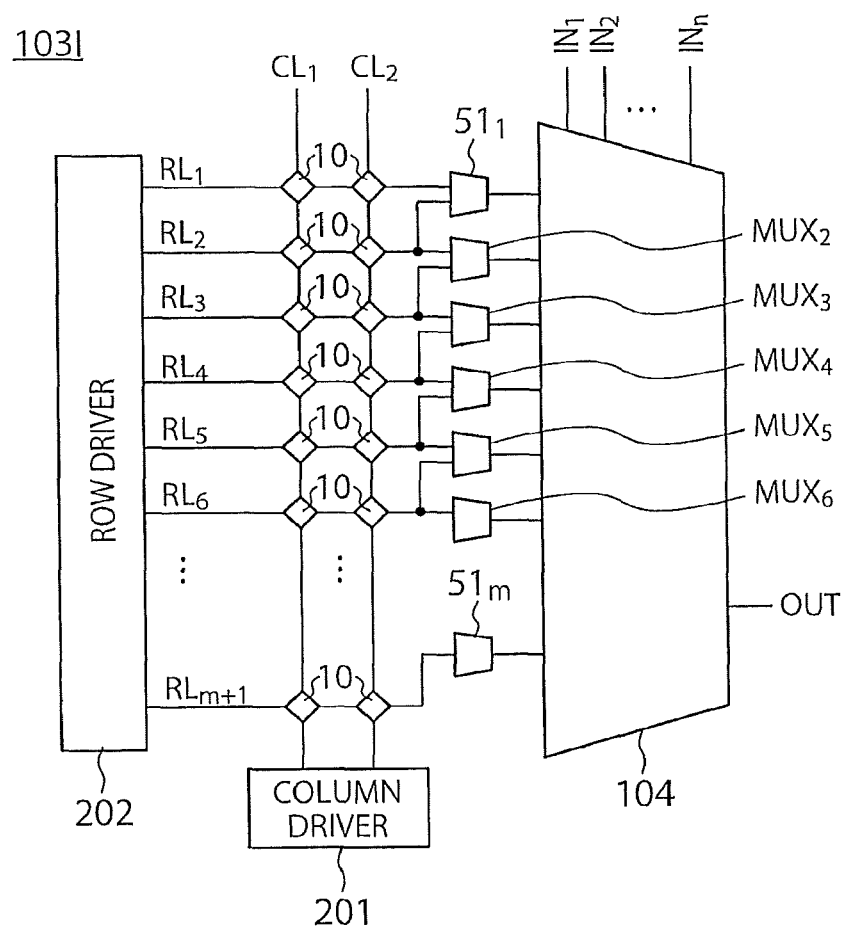
FIG. 14 is a diagram showing a look-up table circuit of an eighth embodiment.

Referring now to FIG. 14, an Integrated circuit according to the eighth embodiment is described. The integrated circuit of the eighth embodiment includes a look-up table circuit 103I shown in FIG. 14. The look-up table circuit 103I of the eighth embodiment is the same as the look-up table circuit 103 shown in FIG. 5, except for further including a row wiring line $RL_{m+1}$ and m switch circuits (multiplexers) $51_1$ through $51_m$. The row wiring line $RL_{m+1}$ can be regarded as a spare of the row wiring lines $RL_1$ through $RL_m$.

Specifically, the look-up table circuit 103I of the eighth embodiment includes n select lines $IN_1$ through $IN_n$, an output line OUT, a multiplexer 104, two column wiring lines $CL_1$ and $CL_2$, (m+1) (m≥1) row wiring lines $RL_1$ through $RL_{m+1}$, memory elements 10 disposed at the intersection points between the column wiring lines and the row wiring lines, and m switch circuits $51_1$ through $51_m$. Each of these memory elements 10 is one of the resistive change elements shown in FIGS. 2 through 3B, for example.

These resistive change elements 10 are disposed in the intersection regions between the two column wiring lines $CL_1$ and $CL_2$, and the (m+1) row wiring lines $RL_1$ through $RL_{m+1}$, as in the case explained with reference to FIG. 4. In a resistive change element 10, one of the two electrodes (or two terminals) is connected to the one of the two column wiring lines $CL_1$ and $CL_2$ corresponding to the Intersection region in which the resistive change element 10 is disposed, and the other one of the two electrodes (or two terminals) is connected to the one of the (m+1) row wiring lines $RL_1$ through $RL_{m+1}$ corresponding to the Intersection region in which the resistive change element 10 is disposed.

The column wiring lines $CL_1$ and $CL_2$ are connected to a column driver 201, and the row wiring lines $RL_1$ through $RL_{m+1}$ are connected to a row driver 202. The column driver 201 and the row driver 202 switch the resistance state of a selected memory element 10 by applying a write voltage to the selected memory element 10. One of the column wiring lines $CL_1$ and $CL_2$ is connected to a first voltage supply that generates a power supply voltage Vdd, and the other one of the column wiring lines $CL_1$ and $CL_2$ is connected to a second voltage supply that generates a ground voltage Vss.

Each switch circuit $51_i$ (1≤i≤m) selects one of the row wiring lines $RL_i$ and $RL_{i+1}$, and transmits the potential of the selected row wiring line to the corresponding input terminal of the select circuit 104.

The eighth embodiment designed as above can also provide an Integrated circuit including a look-up table circuit that can reduce the defect rate.

In the eighth embodiment, transistors may be disposed between the column driver 201 and the column wiring lines $CL_1$ and $CL_2$, between the row driver 202 and the row wiring lines $RL_1$ through $RL_m$, between the row wiring lines $RL_1$ through $RL_m$ and the multiplexer 104, between the column wiring line $CL_1$ and the first voltage supply, and between the column wiring line $CL_2$ and the second voltage supply, as in the second modification of the first embodiment shown in FIG. 7B. Further, inverters (or buffers) may be disposed between the row wiring lines $RL_1$ through $RL_m$ and the multiplexer 104.

Since the number of row wiring lines is normally larger than the number of column wiring lines, the number of switch circuits $51_1$ through $51_m$ is large, and accordingly, the area of the entire circuit is large in this embodiment. In each of the look-up table circuits of the first through seventh embodiments, the number of switch circuits necessary in selecting (switching) a column wiring line can be restricted to a small value, and accordingly, the area of the entire look-up table circuit can be made smaller.

(Switch Circuits)

Next, a switch circuit to be used in selecting or switching a column wiring line CL or a row wiring line RL in a look-up table circuit is described.

Figure 15:
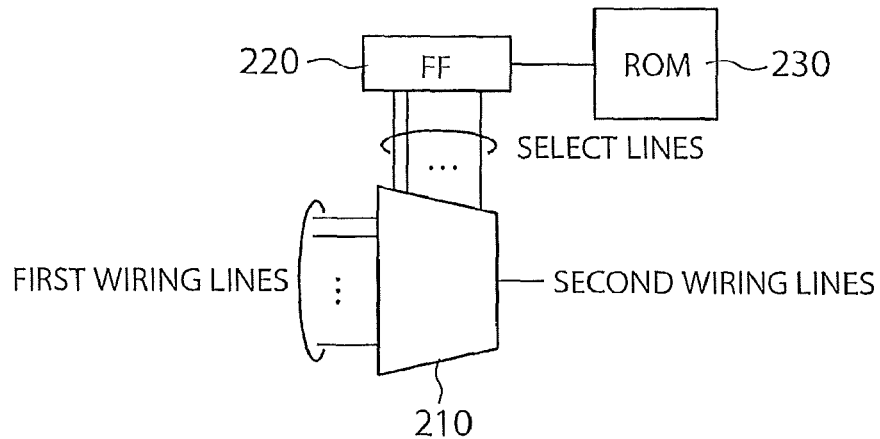
FIG. 15 is a circuit diagram showing a first example of a multiplexer circuit.

FIG. 15 shows a first example of a switch circuit that is used in a circuit having spare memory elements. The switch circuit 200 of the first example includes a select circuit 210, a flip-flop (FF) 220 to which the select lines of the select circuit 210 are connected, and a ROM (Read Only Memory) 230.

The select circuit 210 selects one of first wiring lines in accordance with information stored in the FF 220, and connects the selected first wiring line to a second wiring line. The first wiring lines or the second wiring line is the input wiring line(s), and the other is the output wiring line(s). Here, the select circuit 210 functions as a multiplexer or a demultiplexer. Hereinafter, the select circuit 210 will be explained as the multiplexer 210. Although the select lines are shown in FIG. 15, there may be only one select line. The same applies to the multiplexers 210 of the other examples described later. Since the FF 220 is a volatile memory, the Information in the FF 220 is lost when the power is turned off. Therefore, the ROM 230 formed with a nonvolatile memory element needs to be prepared separately, and the FF 220 loads information thereinto from the ROM 230 after the power is turned on. That is, the ROM 230 stores the Information that determines which first wiring line is to be selected by the multiplexer 210. The ROM 230 may be formed with a memory using a fuse or an anti-fuse, a NOR flash memory, or the like.

In the switch circuit 200 of the first example shown in FIG. 15, the FF 220 occupies a large proportion of the area. Furthermore, the ROM 230 is necessary.

In view of this, the FF 220 and the ROM 230 are replaced with a switch circuit that includes a nonvolatile memory using the resistive change element shown in one of FIGS. 2 through 3B as a memory element.

Figure 16:
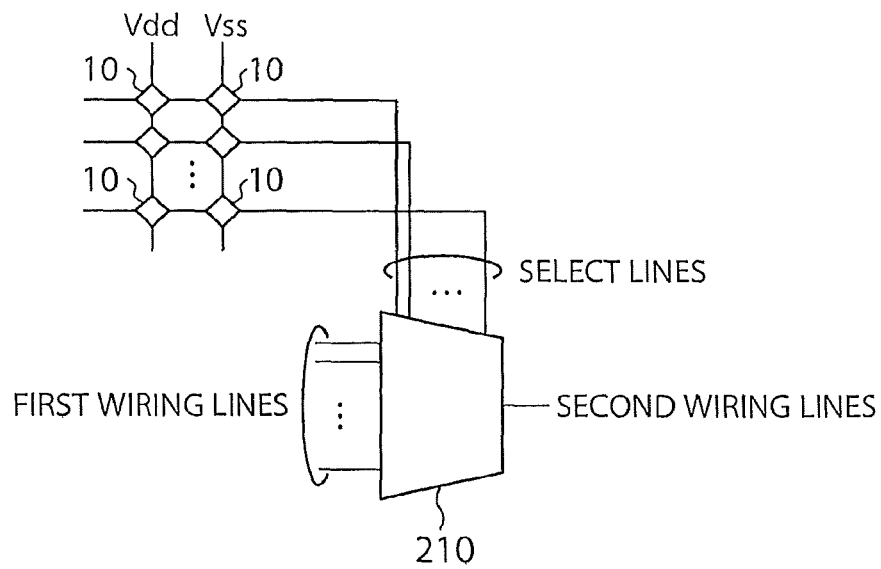
FIG. 16 is a circuit diagram showing a second example of a multiplexer circuit.

FIG. 16 shows a switch circuit 200A of a second example using such a nonvolatile memory.

In the switch circuit 200A shown in FIG. 16, each select line is connected to two memory elements 10. One of the two memory elements 10 is connected to a first voltage supply that generates a power supply voltage Vdd, and the other one of the two memory elements 10 is connected to a second voltage supply that generates a ground voltage Vss. Programming is performed so that one of the memory element connected to the first voltage supply Vdd and the memory element connected to the second voltage supply Vss is put into a low-resistance state, and the other one of the memory elements is put into a high-resistance state. Thus, the power supply voltage Vdd or the ground voltage Vss is applied to the corresponding select line.

In the second example, the FF 220 and the ROM 230 shown in FIG. 15 are replaced with a nonvolatile memory including the resistive change element 10 shown in one of FIGS. 2 through 3B as each memory element. Thus, the occupied area can be reduced. Furthermore, there is no need to load data from the ROM 230 when the power is turned on.

However, if the memory elements 10 connected to the select lines include a memory element 10 in a defective condition, a wrong first wiring line might be selected, and the circuit might perform in an incorrect manner.

Figure 17:
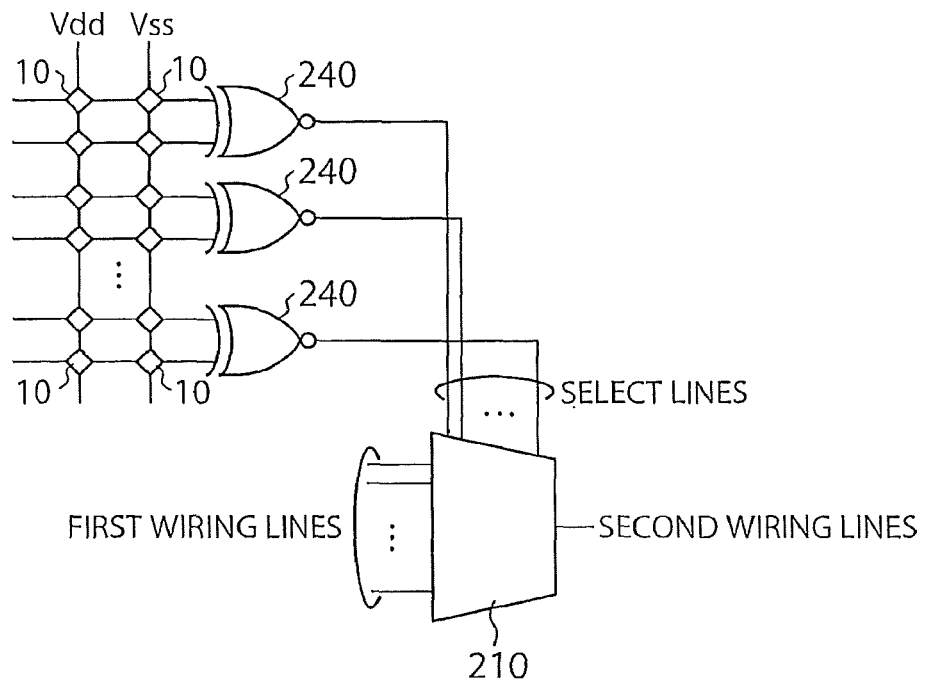
FIG. 17 is a circuit diagram showing a third example of a multiplexer circuit.

FIG. 17 shows a third example of a switch circuit that can select a correct first wiring line even in a case where some of memory elements 10 are in a defective condition. In the switch circuit 200B of the third example, each select line is connected to the output terminal of an XNOR (Exclusive NOR) gate 240. Each of the input terminals of each XNOR gate 240 is connected to two memory elements 10.

One of the two memory elements 10 is connected to a first voltage supply that generates a power supply voltage Vdd, and the other one of the two memory elements 10 is connected to a second voltage supply that generates a ground voltage Vss. Programming is performed so that one of the memory element connected to the first voltage supply Vdd and the memory element connected to the second voltage supply Vss is put into a low-resistance state, and the other one of the memory elements is put into a high-resistance state. Thus, the power supply voltage Vdd or the ground voltage Vss is applied to the Input terminals of the corresponding XNOR gate 240. In the switch circuit 200B of the third example, the XNOR gates 240 and the memory elements 10 arranged in an array constitute a memory circuit.

Figure 18:
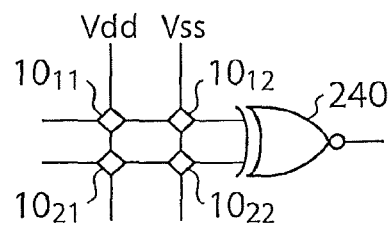
FIG. 18 is a circuit diagram showing one XNOR gate and the corresponding four memory elements in a multiplexer circuit of a third example.

A method of coping with a memory element 10 in a defective condition in the switch circuit 200B shown in FIG. 17 is now described. FIG. 18 shows one XNOR gate 240 and the corresponding four memory elements $10_{11}$ through $10_{22}$ In the switch circuit 200B shown in FIG. 17. In a case where a high-level voltage, or the power supply voltage Vdd, is to be output from the XNOR gate 240, the memory elements $10_{11}$ and $10_{21}$ are put into a low-resistance state, and the memory elements $10_{12}$ and $10_{22}$ are put into a high-resistance state. Alternatively, the memory elements $10_{11}$ and $10_{21}$ are put into a high-resistance state, and the memory elements $10_{12}$ and $10_{22}$ are put into a low-resistance state.

In a case where a low-level voltage, or the ground voltage Vss, is to be output from the XNOR gate 240, on the other hand, the memory elements $10_{11}$ and $10_{22}$ are put into a low-resistance state, and the memory elements $10_{12}$ and $10_{21}$ are put into a high-resistance state. Alternatively, the memory elements $10_{11}$ and $10_{22}$ are put into a high-resistance state, and the memory elements $10_{12}$ and $10_{21}$ are put into a low-resistance state.

In a case where the memory element $10_{11}$ is in a defective condition, for example, the memory element $10_{11}$ is either in a permanent low-resistance state or in a permanent high-resistance state, and cannot change in state. However, regardless of the resistance state of the memory element $10_{11}$, it is possible to cause the XNOR gate 240 to output the power supply voltage Vdd or the ground voltage Vss by controlling the resistance states of the other memory elements $10_{12}$, $10_{21}$, and $10_{22}$. In a case where the memory element $10_{11}$ is in a permanent low-resistance state, for example, the memory elements $10_{12}$, $10_{21}$, and $10_{22}$ are put into a high-resistance state, a low-resistance state, and a high-resistance state, respectively, so that the power supply voltage Vdd is output from the XNOR gate 240. Alternatively, the memory elements $10_{12}$, $10_{21}$, and $10_{22}$ are put into a high-resistance state, a high-resistance state, and a low-resistance state, respectively, so that the ground voltage Vss is output from the XNOR gate 240.

As the switch circuit 200B shown in FIG. 17 is used, a correct voltage can be sent to each select line of the multiplexer 210, even if there is a defective memory element.

Figure 19:
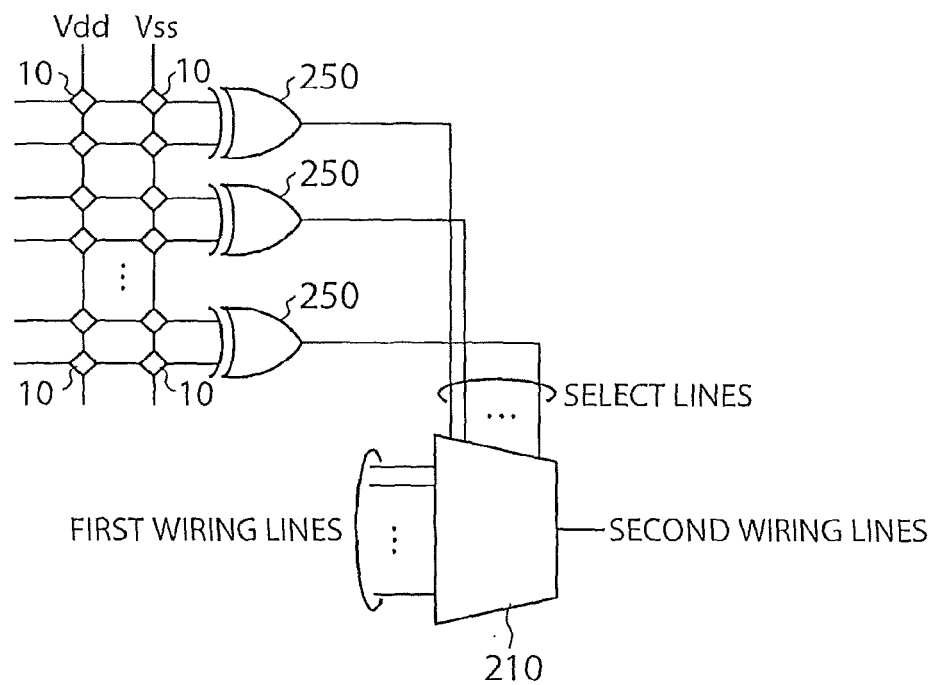
FIG. 19 is a circuit diagram showing a fourth example of a multiplexer circuit.
Figure 20:
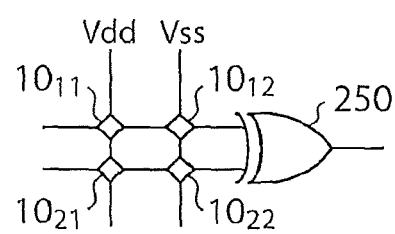
FIG. 20 is a circuit diagram showing one XOR gate and the corresponding four memory elements in a multiplexer circuit of the fourth example.

Although XNOR gates are used in FIGS. 17 and 18, a switch circuit 200C including XOR (Exclusive OR) gates 250 may be used instead as shown in FIGS. 19 and 20.

FIG. 19 is a circuit diagram showing a fourth example of a switch circuit. FIG. 20 shows one XOR gate 250 and the corresponding four memory elements $10_{11}$ through $10_{22}$ In the switch circuit 200C shown in FIG. 19. In the switch circuit 200C of the fourth example, the XOR gates 250 and the memory elements 10 arranged in an array constitute a memory circuit.

In a case where the power supply voltage Vdd is to be output from an XOR gate 250, the memory elements $10_{11}$ and $10_{22}$ are put into a low-resistance state, and the memory elements $10_{12}$ and $10_{21}$ are put into a high-resistance state. Alternatively, the memory elements $10_{11}$ and $10_{22}$ are put into a high-resistance state, and the memory elements $10_{12}$ and $10_{21}$ are put into a low-resistance state.

In a case where the ground voltage Vss is to be output from the XOR gate 250, the memory elements $10_{11}$ and $10_{21}$ are put into a low-resistance state, and the memory elements $10_{12}$ and $10_{22}$ are put into a high-resistance state. Alternatively, the memory elements $10_{11}$ and $10_{21}$ are put into a high-resistance state, and the memory elements $10_{12}$ and $10_{22}$ are put into a low-resistance state.

In this example, even if there is a defective memory element, it is also possible to cause the XOR gate 250 to output the power supply voltage Vdd or the ground voltage Vss by controlling the resistance states of the other memory elements. In a case where the memory element $10_{11}$ is in a permanent low-resistance state, for example, the memory elements $10_{12}$, $10_{21}$, and $10_{22}$ are put into a high-resistance state, a high-resistance state, and a low-resistance state, respectively, so that the power supply voltage Vdd is output from the XOR gate 250. Alternatively, the memory elements $10_{12}$, $10_{21}$, and $10_{22}$ are put into a high-resistance state, a low-resistance state, and a high-resistance state, respectively, so that the ground voltage Vss is output from the XOR gate 250.

As the switch circuit 200C shown in FIG. 19 is used, a correct voltage can be sent to each select line of the multiplexer 210, even if there is a defective memory element.

In a case where the switch circuit shown in FIG. 17 or 19 is applied to the switch circuits $51_1$, $51_2$, and the like of the first through eighth embodiments, each switch circuit may include a memory circuit formed with memory elements 10 and XNOR gates 240, or a memory circuit formed with memory elements 10 and XOR gates 250. Alternatively, such a memory circuit may be shared by two or more switch circuits. For example, in the look-up table circuit 103C shown in FIG. 8A, the column wiring line to be selected by the switch circuit $51_1$ is the same as the column wiring line to be selected by the switch circuit $51_3$, and therefore, these switch circuits may share the same memory circuit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the Inventions. The accompanying claims and their equivalents are intended to cover such forms or modifications as would fall within the scope and spirit of the Inventions.

The invention claimed is:

1. An integrated circuit comprising:
a first wiring line group including at least three first wiring lines;
a second wiring line group including a plurality of second wiring lines intersecting with the first wiring lines;
a plurality of first resistive change elements disposed in intersection regions between the first wiring lines and the second wiring lines, the first resistive change elements each including a first terminal, a second terminal, and a first resistive change layer interposed between the first terminal and the second terminal, the first terminal being connected to a corresponding one of the first wiring lines, and the second terminal being connected to a corresponding one of the second wiring lines;
a first select circuit including a plurality of first input terminals connected to the second wiring lines and a first output terminal, the first input terminals receiving information from the second wiring lines, the first select circuit configured to select a first input terminal from the first input terminals in accordance with a select signal, and output information from the first output terminal, the information corresponding to information received at the selected first input terminal;
a third wiring line;
a fourth wiring line; and
a second select circuit configured to select two first wiring lines from the first wiring line group, connect one of the selected two first wiring lines to the third wiring line, and connect the other one of the selected two first wiring lines to the fourth wiring line.

2. The integrated circuit according to claim 1, wherein:
the second select circuit includes a first switch circuit and a second switch circuit;
the first switch circuit selects a first wiring line from the first wiring line group, and connects the selected first wiring line to the third wiring line; and
the second switch circuit selects another first wiring line from the first wiring line group, and connects the selected another first wiring line to the fourth wiring line, the selected another first wiring line being different from the first wiring line selected by the first switch circuit.

3. The integrated circuit according to claim 2, wherein:
the first wiring line group includes a first section and a second section, the first section and the second section each including at least two first wiring lines, the first section and the second section being different from each other;
the first switch circuit selects a first wiring line from the first section, and connects the selected first wiring line to the third wiring line; and
the second switch circuit selects another first wiring line from the second section, and connects the selected another first wiring line to the fourth wiring line, the selected another first wiring line being different from the first wiring line selected by the first switch circuit.

4. The integrated circuit according to claim 2, wherein:
the first wiring line group includes a first section and a second section, the first section and the second section each including at least two first wiring lines, the first section and the second section sharing at least one first wiring line;
the first switch circuit selects a first wiring line from the first section, and connects the selected first wiring line to the third wiring line; and
the second switch circuit selects a first wiring line from the second section, and connects the selected first wiring line to the fourth wiring line, the first wiring line selected by the second switch circuit being other than the first wiring line selected by the first switch circuit.

5. The integrated circuit according to claim 1, further comprising:
a first driver configured to select a first wiring line from the first wiring line group, and apply a voltage to the selected first wiring line;
a second driver configured to select a second wiring line from the second wiring line group, and apply a voltage to the selected second wiring line; and
a third select circuit configured to select two first wiring lines from the first wiring line group, and connect the selected two first wiring lines to the first driver,
wherein the two first wiring lines selected by the third select circuit are the same as the two first wiring lines selected by the second select circuit.

6. The integrated circuit according to claim 1, further comprising:
a first driver configured to select one of the third wiring line and the fourth wiring line, and apply a voltage to the selected wiring line; and
a second driver configured to select a second wiring line from the second wiring line group, and apply a voltage to the selected second wiring line.

7. The integrated circuit according to claim 5, further comprising:
a first transistor interposed between one of the third wiring line and the fourth wiring line, and a first power supply terminal, a first voltage being applied to the first power supply terminal;
a second transistor interposed between the other one of the third wiring line and the fourth wiring line, and a second power supply terminal, a second voltage being applied to the second power supply terminal;
a third transistor interposed between the first driver and the third select circuit; and
a plurality of fourth transistors interposed between the second driver and the respective second wiring lines.

8. The integrated circuit according to claim 6, wherein:
one of the third wiring line and the fourth wiring line is connected to a first power supply terminal while the other one of the third wiring line and the fourth wiring line is connected to a second power supply terminal, a first voltage being applied to the first power supply terminal, a second voltage being applied to the second power supply terminal; and
the integrated circuit further comprises:
a first transistor interposed between one of the third wiring line and the fourth wiring line, and the first power supply terminal;
a second transistor interposed between the other one of the third wiring line and the fourth wiring line, and the second power supply terminal;
a third transistor interposed between the first driver and the third wiring line;
a fourth transistor interposed between the first driver and the fourth wiring line; and a plurality of fifth transistors interposed between the second driver and the respective second wiring lines.

9. The integrated circuit according to claim 1, wherein a resistance between the first terminal and the second terminal in each of the resistive change elements can be irreversibly switched from a high-resistance state to a low-resistance state.

10. The integrated circuit according to claim 9, wherein:
each of the resistive change elements is a transistor including a source, a drain, and a gate;
when the first terminal is the gate of the transistor, the second terminal is at least one of the source and the drain of the transistor; and,
when the first terminal is at least one of the source and the drain of the transistor, the second terminal is the gate of the transistor.

11. An integrated circuit comprising:
a first wiring line group including at least three first wiring lines;
a second wiring line group including a plurality of second wiring lines intersecting with the first wiring lines;
a plurality of first resistive change elements disposed in intersection regions between the first wiring lines and the second wiring lines, the first resistive change elements each including a first terminal, a second terminal, and a first resistive change layer interposed between the first terminal and the second terminal, the first terminal being connected to a corresponding one of the first wiring lines, and the second terminal being connected to a corresponding one of the second wiring lines;
a first select circuit including a plurality of first input terminals connected to the second wiring lines and a first output terminal, the first select circuit configured to select a first input terminal from the first input terminals in accordance with a select signal, and output information from the first output terminal, the information corresponding to information input to the selected first input terminal;
a third wiring line;
a fourth wiring line; and
a second select circuit configured to select two first wiring lines from the first wiring line group, connect one of the selected two first wiring lines to the third wiring line, and connect the other one of the selected two first wiring lines to the fourth wiring line,
wherein the second select circuit includes:
a plurality of fifth wiring lines;
at least one first logic gate, each of the at least one first logic gate being one of an XOR gate and an XNOR gate, each of the XOR gate and the XNOR gate including a second output terminal and a plurality of second input terminals;
a plurality of sixth wiring lines intersecting with the fifth wiring lines, the sixth wiring lines being connected to the second input terminals of the at least one first logic gate;
a plurality of second resistive change elements disposed in intersection regions between the fifth wiring lines and the sixth wiring lines, the second resistive change elements each including a third terminal, a fourth terminal, and a second resistive change layer interposed between the third terminal and the fourth terminal, the third terminal being connected to a corresponding one of the fifth wiring lines, the fourth terminal being connected to a corresponding one of the sixth wiring lines;
a plurality of seventh wiring lines;

at least one second logic gate, each of the at least one second logic gate being one of an XOR gate and an XNOR gate, each of the XOR gate and the XNOR gate including a third output terminal and a plurality of third input terminals;
a plurality of eighth wiring lines intersecting with the seventh wiring lines, the eighth wiring lines being connected to the third input terminals of the at least one second logic gate;
a plurality of third resistive change elements disposed in intersection regions between the seventh wiring lines and the eighth wiring lines, the third resistive change elements each including a fifth terminal, a sixth terminal, and a third resistive change layer interposed between the fifth terminal and the sixth terminal, the fifth terminal being connected to a corresponding one of the seventh wiring lines, the sixth terminal being connected to a corresponding one of the eighth wiring lines;
a first switch circuit including a first select terminal connected to the second output terminal of the at least one first logic gate, the first switch circuit configured to select a first wiring line from the first wiring line group in accordance with a signal input to the first select terminal, and connect the selected first wiring line to the third wiring line; and
a second switch circuit including a second select terminal connected to the third output terminal of the at least one second logic gate, the second switch circuit configured to select another first wiring line from the first wiring line group in accordance with a signal input to the second select terminal, and connect the selected another first wiring line to the fourth wiring line, the selected another first wiring line being different from the first wiring line selected by the first switch circuit.

12. The integrated circuit according to claim 11, wherein:
the first wiring line group includes a first section and a second section, the first section and the second section each including at least two first wiring lines, the first section and the second section being different from each other;
the first switch circuit selects a first wiring line from the first section, and connects the selected first wiring line to the third wiring line; and
the second switch circuit selects another first wiring line from the second section, and connects the selected another first wiring line to the fourth wiring line, the selected another first wiring line being different from the first wiring line selected by the first switch circuit.

13. The integrated circuit according to claim 11, wherein:
the first wiring line group includes a first section and a second section, the first section and the second section each including at least two first wiring lines, the first section and the second section sharing at least one first wiring line;
the first switch circuit selects a first wiring line from the first section, and connects the selected first wiring line to the third wiring line; and
the second switch circuit selects a first wiring line from the second section, and connects the selected first wiring line to the fourth wiring line, the first wiring line selected by the second switch circuit being other than the first wiring line selected by the first switch circuit.

14. The integrated circuit according to claim 11, further comprising:

a first driver configured to select a first wiring line from the first wiring line group, and apply a voltage to the selected first wiring line;

a second driver configured to select a second wiring line from the second wiring line group, and apply a voltage to the selected second wiring line; and a third select circuit configured to select two first wiring lines from the first wiring line group, and connect the selected two first wiring lines to the first driver, wherein the two first wiring lines selected by the third select circuit are the same as the two first wiring lines selected by the second select circuit.

15. The integrated circuit according to claim 11, further comprising:

a first driver configured to select one of the third wiring line and the fourth wiring line, and apply a voltage to the selected wiring line; and a second driver configured to select a second wiring line from the second wiring line group, and apply a voltage to the selected second wiring line.

16. The integrated circuit according to claim 14, further comprising:

a first transistor interposed between one of the third wiring line and the fourth wiring line, and a first power supply terminal, a first voltage being applied to the first power supply terminal;

a second transistor interposed between the other one of the third wiring line and the fourth wiring line, and a second power supply terminal, a second voltage being applied to the second power supply terminal;

a third transistor interposed between the first driver and the third select circuit; and a plurality of fourth transistors interposed between the second driver and the respective second wiring lines.

17. The integrated circuit according to claim 15, wherein:

one of the third wiring line and the fourth wiring line is connected to a first power supply terminal while the other one of the third wiring line and the fourth wiring line is connected to a second power supply terminal, a first voltage being applied to the first power supply terminal, a second voltage being applied to the second power supply terminal; and the integrated circuit further comprises:

a first transistor interposed between one of the third wiring line and the fourth wiring line, and the first power supply terminal;

a second transistor interposed between the other one of the third wiring line and the fourth wiring line, and the second power supply terminal;

a third transistor interposed between the first driver and the third wiring line;

a fourth transistor interposed between the first driver and the fourth wiring line; and a plurality of fifth transistors interposed between the second driver and the respective second wiring lines.

18. The integrated circuit according to claim 11, wherein a resistance between the first terminal and the second terminal in each of the resistive change elements can be irreversibly switched from a high-resistance state to a low-resistance state.

19. The integrated circuit according to claim 18, wherein:

each of the resistive change elements is a transistor including a source, a drain, and a gate;

when the first terminal is the gate of the transistor, the second terminal is at least one of the source and the drain of the transistor; and, when the first terminal is at least one of the source and the drain of the transistor, the second terminal is the gate of the transistor.

* * * * *